(12) United States Patent
Kim et al.

(10) Patent No.: US 11,626,414 B2
(45) Date of Patent: Apr. 11, 2023

(54) THREE-DIMENSIONAL SEMICONDUCTOR MEMORY DEVICES AND METHODS OF FABRICATING THE SAME

(71) Applicant: Samsung Electronics Co., Ltd., Suwon-si (KR)

(72) Inventors: Sunggil Kim, Yongin-si (KR); Sungjin Kim, Hwaseong-si (KR); Seulye Kim, Seoul (KR); Jung-Hwan Kim, Seoul (KR); Chan-Hyoung Kim, Suwon-si (KR)

(73) Assignee: Samsung Electronics Co., Ltd.

( * ) Notice: Subject to any disclaimer, the term of this patent is extended or adjusted under 35 U.S.C. 154(b) by 211 days.

(21) Appl. No.: 16/903,026

(22) Filed: Jun. 16, 2020

(65) Prior Publication Data
US 2021/0098480 A1  Apr. 1, 2021

(30) Foreign Application Priority Data

Sep. 30, 2019 (KR) .................. 10-2019-0120948

(51) Int. Cl.
| | | |
|---|---|---|
| *H01L 27/11568* | (2017.01) | |
| *H01L 27/11556* | (2017.01) | |
| *G11C 5/06* | (2006.01) | |
| *H01L 27/11582* | (2017.01) | |
| *G11C 5/02* | (2006.01) | |

(52) U.S. Cl.
CPC ........ *H01L 27/11556* (2013.01); *G11C 5/025* (2013.01); *G11C 5/06* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 7,749,854 B2 | 7/2010 | Lung | |
| 8,883,576 B2 | 11/2014 | Lee et al. | |
| 9,397,111 B1 | 7/2016 | Chowdhury et al. | |
| 9,524,981 B2 | 12/2016 | Pachamuthu et al. | |
| 9,559,116 B2 | 1/2017 | Kim et al. | |
| 9,685,452 B2 | 6/2017 | Lee et al. | |
| 9,698,153 B2 | 7/2017 | Liu et al. | |
| 9,842,849 B1 * | 12/2017 | Yamasaki | H01L 21/02634 |
| 10,002,875 B2 | 6/2018 | Nam et al. | |

(Continued)

FOREIGN PATENT DOCUMENTS

| | | |
|---|---|---|
| KR | 10-2012-0029291 A | 3/2012 |
| KR | 10-1933116 B1 | 12/2018 |

*Primary Examiner* — Sarah K Salerno
(74) *Attorney, Agent, or Firm* — Myers Bigel, P.A.

(57) ABSTRACT

Disclosed are semiconductor memory devices and methods of fabricating the same. A semiconductor memory device includes a stack structure that includes a plurality of electrodes and a plurality of dielectric layers that are alternately stacked on a substrate, a vertical channel structure that penetrates the stack structure, and a conductive pad on the vertical channel structure. The vertical channel structure includes a semiconductor pattern and a vertical dielectric layer between the semiconductor pattern and the electrodes. An upper portion of the semiconductor pattern includes an impurity region that includes a halogen element. The upper portion of the semiconductor pattern is adjacent to the conductive pad.

20 Claims, 24 Drawing Sheets

(56) References Cited

U.S. PATENT DOCUMENTS

| | | | |
|---|---|---|---|
| 2012/0068242 A1* | 3/2012 | Shin | H01L 27/11578 |
| | | | 257/315 |
| 2014/0070300 A1 | 3/2014 | Jang et al. | |
| 2015/0017772 A1* | 1/2015 | Waite | H01L 27/11582 |
| | | | 438/269 |
| 2016/0148948 A1* | 5/2016 | Kim | H01L 23/528 |
| | | | 438/269 |
| 2018/0211971 A1 | 7/2018 | Ishida et al. | |
| 2018/0247949 A1 | 8/2018 | Choi | |
| 2019/0067025 A1 | 2/2019 | Yada et al. | |
| 2019/0074284 A1 | 3/2019 | Akutsu et al. | |
| 2020/0144284 A1* | 5/2020 | Choi | H01L 29/1033 |
| 2020/0194441 A1* | 6/2020 | Kwon | H01L 27/11519 |
| 2021/0313427 A1* | 10/2021 | Kim | H01L 24/08 |

\* cited by examiner

THREE-DIMENSIONAL SEMICONDUCTOR MEMORY DEVICES AND METHODS OF FABRICATING THE SAME

CROSS-REFERENCE TO RELATED APPLICATION

This U.S. non-provisional application claims priority under 35 U.S.C § 119 to Korean Patent Application No. 10-2019-0120948, filed on Sep. 30, 2019, in the Korean Intellectual Property Office, the disclosure of which is hereby incorporated by reference in its entirety.

BACKGROUND

The present disclosure relates to semiconductor devices and, more particularly, to three-dimensional semiconductor memory devices with improved reliability and methods of fabricating the same. Semiconductor devices have been highly integrated for satisfying high performance and low manufacturing costs that may be demanded by customers. Because integration of semiconductor devices is an important factor in determining product price, highly integrated semiconductor devices are increasingly demanded. Integration of typical two-dimensional or planar semiconductor devices is primarily determined by the area occupied by a unit memory cell, such that it is greatly influenced by the level of technology for forming fine patterns. However, the extremely expensive processing equipment that may be used to increase pattern fineness may set a practical limitation on increasing the integration of the two-dimensional or planar semiconductor devices. Therefore, there have been proposed three-dimensional semiconductor memory devices having three-dimensionally arranged memory cells.

SUMMARY

Some example embodiments of the present inventive concepts provide a three-dimensional semiconductor memory device with improved reliability and a method of fabricating the same.

According to some example embodiments of the present inventive concepts, a semiconductor memory device may include: a stack structure that includes a plurality of electrodes and a plurality of dielectric layers that are alternately stacked on a substrate; a vertical channel structure that penetrates the stack structure; and a conductive pad on the vertical channel structure. The vertical channel structure may include a semiconductor pattern and a vertical dielectric layer between the semiconductor pattern and the electrodes. An upper portion of the semiconductor pattern may include an impurity region that includes a halogen element, the upper portion being adjacent to the conductive pad.

According to some example embodiments of the present inventive concepts, a semiconductor memory device may include: a stack structure that includes a plurality of electrodes and a plurality of dielectric layers that are alternately stacked on a substrate; a vertical channel structure that penetrates the stack structure; and a conductive pad on the vertical channel structure. The vertical channel structure may include a filling dielectric pattern, a semiconductor pattern, and a vertical dielectric layer that is between the semiconductor pattern and the electrodes. The semiconductor pattern may be between the vertical dielectric layer and the filling dielectric pattern. The filling dielectric pattern may have a top surface that is lower than a top surface of the vertical dielectric layer. The semiconductor pattern may have a top surface that is lower than the top surface of the vertical dielectric layer. An uppermost part of the top surface of the filling dielectric pattern may be at a first level. An uppermost part of the top surface of the semiconductor pattern may be at a second level. The first level and the second level may be different from each other.

According to some example embodiments of the present inventive concepts, a semiconductor memory device may include: a stack structure on a substrate; a vertical channel structure that penetrates the stack structure, the vertical channel structure including a filling dielectric pattern, a semiconductor pattern, and a vertical dielectric layer that is between the semiconductor pattern and the stack structure; a conductive pad on the vertical channel structure and electrically connected to the semiconductor pattern; and a bit line electrically connected to the conductive pad. The stack structure includes: a plurality of electrodes and a plurality of first dielectric layers that are alternately stacked on the substrate; and a second dielectric layer on an uppermost one of the electrodes. The vertical dielectric layer includes a blocking dielectric layer, a charge storage layer, and a tunnel dielectric layer. The charge storage layer is between the blocking dielectric layer and the tunnel dielectric layer. A top surface of the filling dielectric pattern is at a level different from a level of a top surface of the semiconductor pattern. The conductive pad includes a first pad and a second pad on the first pad. The first pad is on the top surface of the filling dielectric pattern and the top surface of the semiconductor pattern. The first pad has a top surface that is concave toward the substrate. The second pad is on the top surface of the first pad. A top surface of the second pad is coplanar with a top surface of the second dielectric layer.

According to some example embodiments of the present inventive concepts, a method of fabricating a semiconductor memory device may include: alternately stacking dielectric layers and sacrificial layers to form a stack structure on a substrate; forming a vertical channel structure that penetrates the stack structure, the vertical channel structure including a filling dielectric pattern, a semiconductor pattern, and a vertical dielectric layer that is between the semiconductor pattern and the stack structure; forming a conductive pad on the vertical channel structure, the conductive pad being electrically connected to the semiconductor pattern; and replacing the sacrificial layers with electrodes.

Forming the conductive pad may include: recessing an upper portion of the filling dielectric pattern to form a first recessed top surface of the filling dielectric pattern; recessing an exposed upper portion of the semiconductor pattern to form a second recessed top surface of the semiconductor pattern, where a level of the second recessed top surface is different from a level of the first recessed top surface; forming a first pad layer on the first and second recessed top surfaces; recessing an upper portion of the first pad layer to form a third recessed top surface of the first pad layer; forming on the first pad layer a second pad layer that covers the third recessed top surface; and performing a planarization process on the first and second pad layers until a top surface of an uppermost dielectric layer of the stack structure is exposed.

DETAILED DESCRIPTION

Figure 1:
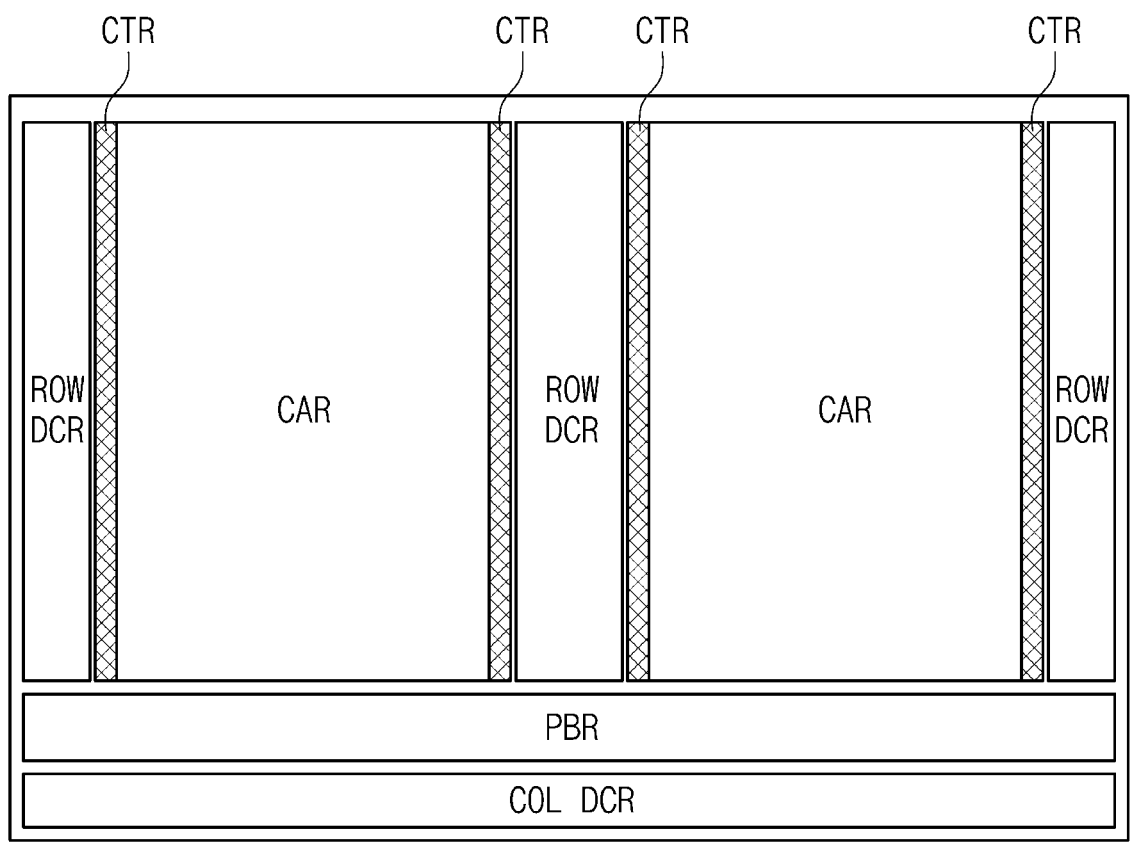
FIG. 1 illustrates a schematic diagram showing a simplified configuration of a three-dimensional semiconductor memory device according to some example embodiments of the present inventive concepts.

FIG. 1 illustrates a schematic diagram showing a simplified configuration of a three-dimensional semiconductor memory device according to some example embodiments of the present inventive concepts.

Referring to FIG. 1, a three-dimensional semiconductor memory device may include a cell array region CAR and a peripheral circuit region. The peripheral circuit region may include row decoder regions ROW DCR, a page buffer region PBR, a column decoder region COL DCR, and a control circuit region (not shown). In some embodiments, a connection region CTR may be disposed between the cell array region CAR and each of the row decoder regions ROW DCR.

The cell array region CAR may include a memory cell array including a plurality of memory cells. In some embodiments, the memory cell array may include three-dimensionally arranged memory cells and a plurality of word lines and bit lines electrically connected to the memory cells.

The row decoder region ROW DCR may include a row decoder that selects the word lines of the memory cell array, and the connection region CTR may include a connection line structure that electrically connects the memory cell array to the row decoder. Based on address information, the row decoder may select one of the word lines of the memory cell array. The row decoder may provide word-line voltages to the selected word line and unselected word lines, in response to a control signal from a control circuit.

The page buffer region PBR may include a page buffer that reads data stored in the memory cells. Depending on an operating mode, the page buffer may temporarily store data to be stored in the memory cells or sense data stored in the memory cells. The page buffer may act as a write driver circuit in a program operating mode and as a sense amplifier circuit in a read operating mode.

The column decoder region COL DCR may include a column decoder connected to the bit lines of the memory cell array. The column decoder may provide a data transmission path between the page buffer and an external device (e.g., a memory controller).

Figure 2:
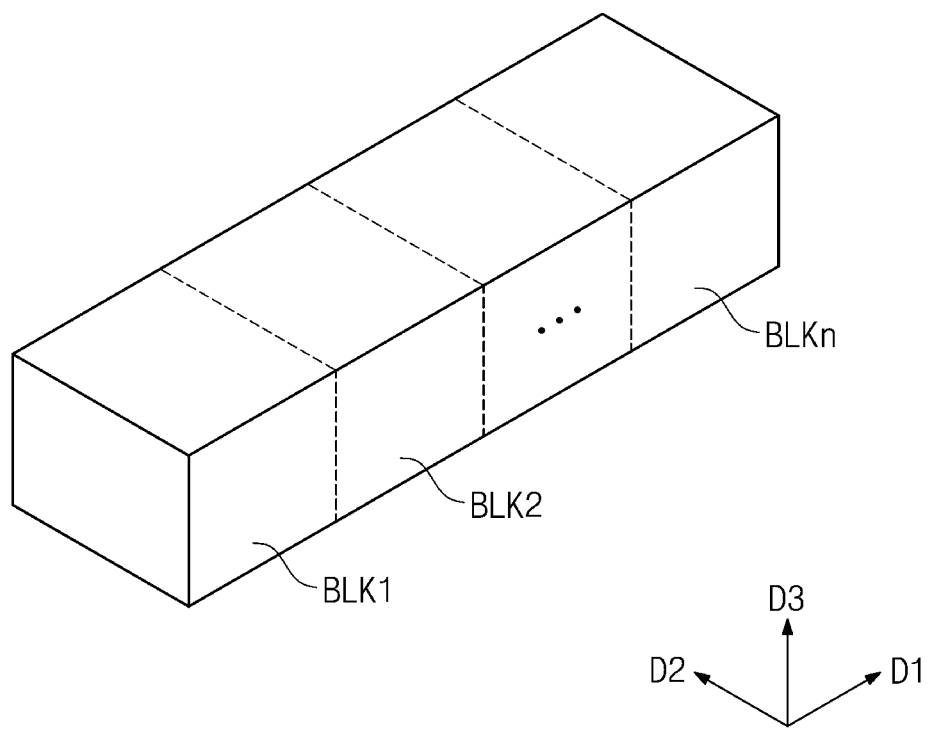
FIG. 2 illustrates a simplified block diagram showing a cell array of a three-dimensional semiconductor memory device according to some example embodiments of the present inventive concepts.

FIG. 2 illustrates a simplified block diagram showing a cell array of a three-dimensional semiconductor memory device according to some example embodiments of the present inventive concepts.

Referring to FIG. 2, the cell array region CAR may include a plurality of cell array blocks BLK1, BLK2, . . . , and BLKn. Each of the cell array blocks BLK1, BLK2, . . . , and BLKn may include a stack structure including electrodes stacked along a third direction D3 on a plane elongated along first and second directions D1 and D2. The stack structure may combine with a plurality of vertical channel structures (or semiconductor pillars) to thereby constitute three-dimensionally arranged memory cells. In addition, each of the cell array blocks BLK1, BLK2, . . . , and BLKn may include bit lines electrically connected to the memory cells.

Figure 3:
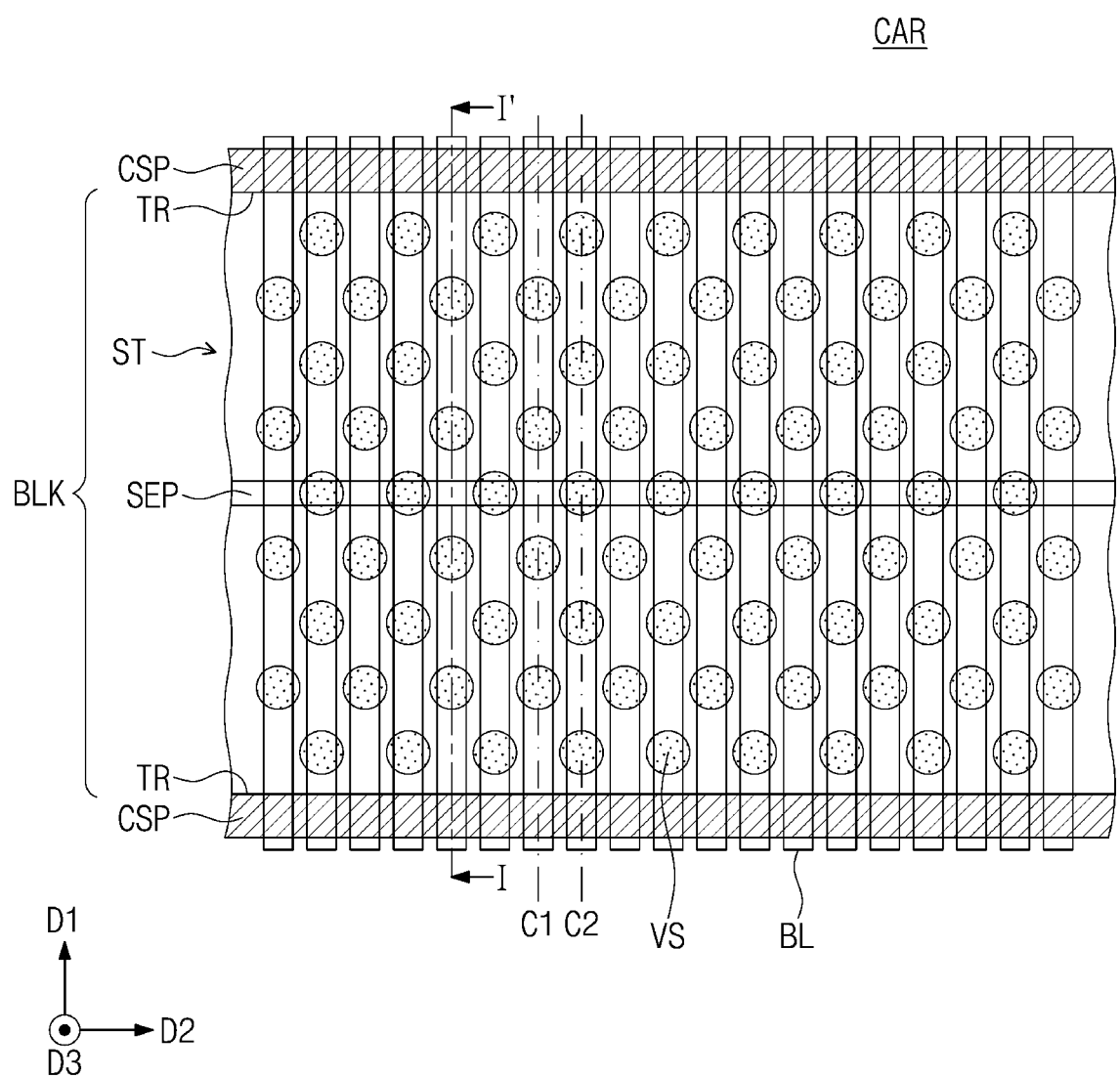
FIG. 3 illustrates a plan view showing a three-dimensional semiconductor memory device according to some example embodiments of the present inventive concepts.
Figure 4:
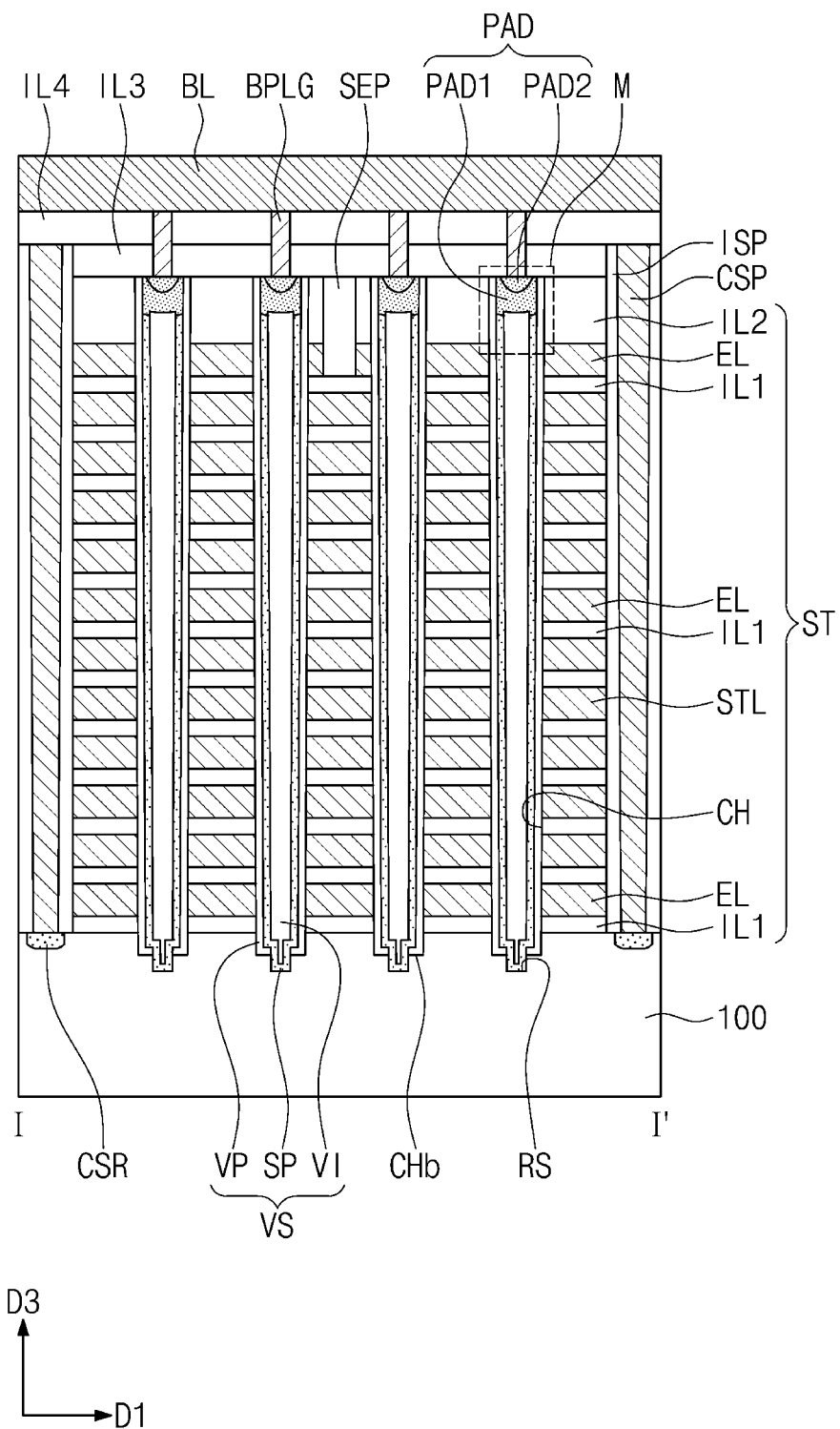
FIG. 4 illustrates a cross-sectional view taken along line I-I' of FIG. 3.
Figure 5:
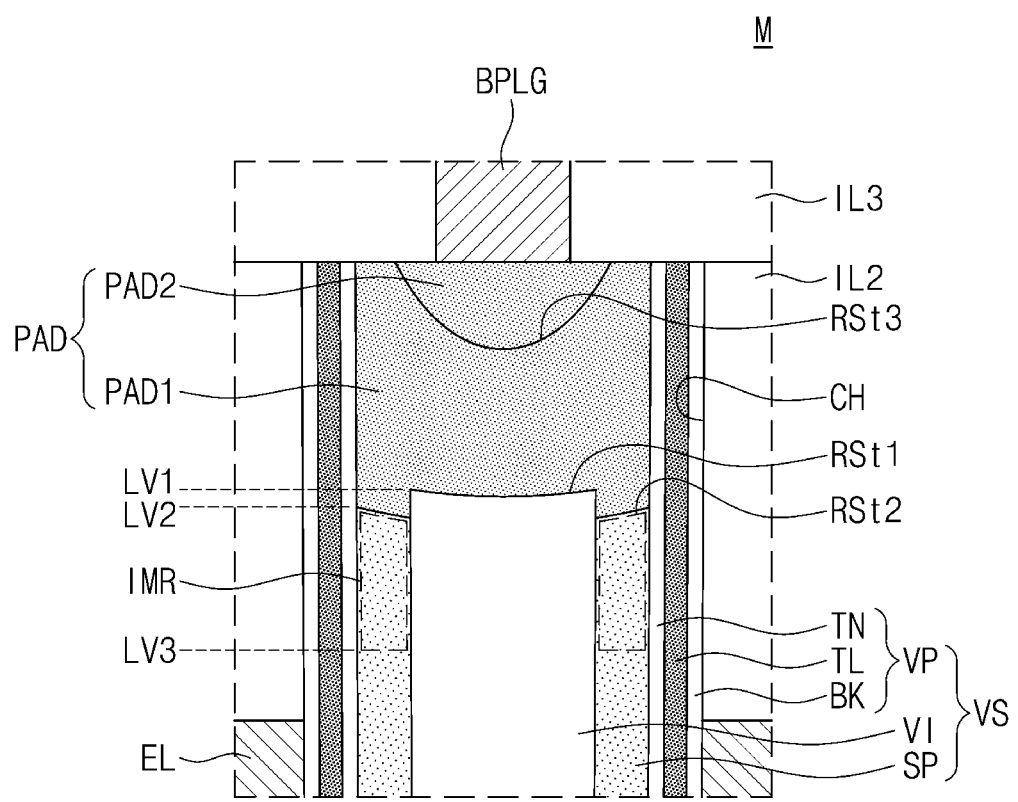
FIG. 5 illustrates an enlarged cross-sectional view showing section M of FIG. 4.

FIG. 3 illustrates a plan view showing a three-dimensional semiconductor memory device according to some example embodiments of the present inventive concepts. FIG. 4 illustrates a cross-sectional view taken along line I-I' of FIG. 3. FIG. 5 illustrates an enlarged cross-sectional view showing section M of FIG. 4.

Referring to FIGS. 3, 4, and 5, a substrate 100 may be provided which includes a cell array region CAR. For example, the substrate 100 may be a silicon substrate, a germanium substrate, or a silicon-germanium substrate. The substrate 100 may have a first conductive type (e.g., p-type).

A cell array block BLK may be disposed on the substrate 100. The cell array block BLK may include a stack structure ST including first dielectric layers ILL electrodes EL, and stopper layers STL. The stack structure ST may extend along a second direction D2 on the cell array region CAR. A single stack structure ST is illustrated in FIG. 3, but example embodiments are not limited thereto and a plurality of stack structures ST may be provided. The plurality of stack structures ST may be arranged along a first direction D1 intersecting the second direction D2.

Common source regions CSR may be provided on opposite sides of the stack structure ST. The common source regions CSR may be formed on/in an upper portion of the substrate 100. The common source regions CSR may extend in the second direction D2 parallel to the stack structure ST. The common source regions CSR may be doped with impurities to have a second conductive type. For example, the common source regions CSR may be doped with impurities, such as arsenic (As) or phosphorus (P), to have an n-type conductive type.

A common source plug CSP may be coupled to the common source region CSR. The common source plug CSP may vertically overlap the common source region CSR. The common source plug CSP may extend in the second direction D2 parallel to the stack structures ST. A dielectric spacer ISP may be interposed between the common source plug CSP and the stack structure ST.

The stack structure ST may include the first dielectric layers IL1 and the electrodes EL that are vertically and alternately stacked on the substrate 100. The stack structure ST may further include a second dielectric layer IL2 on an uppermost electrode EL. The second dielectric layer IL2 may have a thickness greater than that of the first dielectric layer IL1.

The electrodes EL of the stack structure ST may be stacked along a third direction D3 perpendicular to a top surface of the substrate 100. Vertically neighboring ones of the electrodes EL may be vertically separated from each other by the first dielectric layer IL1 disposed therebetween.

A lowermost electrode EL of the stack structure ST may be a lower selection line. The uppermost electrode EL of the stack structure ST may be an upper selection line. Remaining electrodes EL other than the lower and upper selection lines may be word lines. A separation dielectric pattern SEP may extend in the second direction D2, while running across the uppermost electrode EL (or the upper selection line). The separation dielectric pattern SEP may have a top surface coplanar with that of the second dielectric layer IL2. The separation dielectric pattern SEP may include a dielectric material (e.g., a silicon oxide layer).

The electrodes EL may include a conductive material selected from doped semiconductors (e.g., doped silicon), metals (e.g., tungsten, copper, or aluminum), conductive metal nitrides (e.g., titanium nitride or tantalum nitride), and transition metals (e.g., titanium or tantalum). The first dielectric layers IL1 and the second dielectric layer IL2 may include a silicon oxide layer.

The cell array region CAR may be provided thereon with a plurality of vertical channel structures VS that penetrate the stack structure ST. The vertical channel structures VS may be provided in corresponding channel holes CH of the stack structure ST. For example, a first column C1 may be constituted by four vertical channel structures VS arranged in the first direction D1, and a second column C2 may be constituted by five vertical channel structures VS arranged in the first direction D1. The first column C1 and the second column C2 may be repeatedly and alternately arranged along the second direction D2. Each of the vertical channel structures VS may have a diameter that gradually decreases with decreasing distance from the substrate 100.

Each of the vertical channel structures VS may include a vertical dielectric pattern VP, a semiconductor pattern SP, and a filling dielectric pattern VI. The vertical dielectric pattern VP may extend toward the substrate 100 and along an inner wall of the channel hole CH. The semiconductor pattern SP may cover an inner wall of the vertical dielectric pattern VP, and may extend together with the vertical dielectric pattern VP toward the substrate 100.

A lower portion of the channel hole CH may extend into the substrate 100. For example, the channel hole CH may have a bottom CHb lower than the top surface of the substrate 100. A recess RS may be defined to extend from the bottom CHb of the channel hole CH toward a bottom surface of the substrate 100. A lower portion of the semiconductor pattern SP may fill the recess RS and may directly contact the substrate 100.

The semiconductor pattern SP may have a pipe shape whose bottom is closed. The filling dielectric pattern VI may fill an inside of the semiconductor pattern SP. The semiconductor pattern SP may be used as a channel of a three-dimensional semiconductor memory device according to some example embodiments of the present inventive concepts.

For example, the semiconductor pattern SP may include silicon (Si), germanium (Ge), or a mixture thereof. The semiconductor pattern SP may have a single-crystalline structure or a polycrystalline structure. The semiconductor pattern SP may be either undoped or doped with impurities to have a first conductive type the same as that of the substrate 100.

A conductive pad PAD may be provided on each of the vertical channel structures VS. The conductive pad PAD may include a first pad PAD1 on the vertical channel structure VS and a second pad PAD2 on the first pad PAD1. The conductive pad PAD may have a top surface coplanar with that of the second dielectric layer IL2.

Referring again to FIG. 5, the conductive pad PAD and an upper portion of the vertical channel structure VS will be discussed in detail below. The vertical dielectric pattern VP may include a blocking dielectric layer BK, a charge storage layer TL, and a tunnel dielectric layer TN that are interposed between the electrode EL and the semiconductor pattern SP.

For example, the blocking dielectric layer BK may be provided on the electrode EL and the first and second dielectric layers IL1 and IL2. The blocking dielectric layer BK may cover an inner sidewall of the electrode EL and inner sidewalls of the first and second dielectric layers IL1 and IL2. For example, the blocking dielectric layer BK may cover the inner wall of the channel hole CH. The charge storage layer TL may be provided on the blocking dielectric layer BK. The tunnel dielectric layer TN may be provided on the charge storage layer TL. The tunnel dielectric layer TN may cover an outer wall of the semiconductor pattern SP and an outer wall of the conductive pad PAD. The charge storage layer TL may be interposed between the tunnel dielectric layer TN and the blocking dielectric layer BK.

For example, the blocking dielectric layer BK may include a silicon oxide layer. The charge storage layer TL may include a silicon nitride layer, a silicon oxynitride layer, or a silicon-rich nitride layer. The tunnel dielectric layer TN may include a material whose energy band gap is greater than that of the charge storage layer TL. The tunnel dielectric layer TN may include either a silicon oxide layer or a high-k dielectric layer such as an aluminum oxide layer or a hafnium oxide layer.

A NAND Flash memory device may be adopted as a three-dimensional semiconductor memory device according to some example embodiments of the present inventive concepts. The charge storage layer TL between the electrode EL and the semiconductor pattern SP may be a data storage region of a NAND Flash memory device. Data stored in the charge storage layer TL may be changed by Fowler-Nordheim tunneling induced by a voltage difference between the electrode EL and the semiconductor pattern SP.

The vertical dielectric pattern VP may have a top surface coplanar with that of the second dielectric layer IL2. For example, the blocking dielectric layer BK, the charge storage layer TL, and the tunnel dielectric layer TN may have their top surfaces all of which are coplanar with the top surface of the second dielectric layer IL2.

The filling dielectric pattern VI may have a first recessed top surface RSt1. The first recessed top surface RSt1 may have an uppermost part at a first level LV1. The first recessed top surface RSt1 may be concave toward the substrate 100.

As used herein, the term "recessed" may refer to a top surface that is lower than a top surface of the second dielectric layer IL2 and/or is lower than a top surface of the vertical dielectric pattern VP. Though a "recessed" top surface may be a concave surface, it is not limited thereto and may instead be, for example, a diagonally-sloped surface.

The semiconductor pattern SP may have a second recessed top surface RSt2. The second recessed top surface RSt2 may have an uppermost part at a second level LV2. The second level LV2 may be lower than the first level LV1. A distance from the first level LV1 to the second level LV2 may fall within a range of 10 Angstroms (Å) to 200 Å. The second recessed top surface RSt2 may be adjacent to the first recessed top surface RSt1.

An upper portion of the semiconductor pattern SP may include an impurity region IMR. The impurity region IMR may be positioned below the second recessed top surface RSt2. The impurity region IMR may include halogen elements as impurities. For example, the impurity region IMR may include at least one halogen element, such as fluorine (F), chlorine (Cl), or bromine (Br). The semiconductor pattern SP may have a grain boundary between crystals. The impurities may be kept in the grain boundary. An atomic percent of the halogen element, or impurity concentration, in the impurity region IMR may fall within a range of 1 at % to 5 at %. As an embodiment of the present inventive concepts, the impurity region IMR may further include at least one impurity including oxygen (O), carbon (C), and nitrogen (N).

The impurity region IMR may have a bottom at a third level LV3. The third level LV3 may be lower than the second level LV2. A distance from the second level LV2 to the third level LV3 may fall within a range of 100 Å to 1,000 Å. For example, the impurity region IMR may have a depth of 100 Å to 1,000 Å.

The conductive pad PAD may be provided on the semiconductor pattern SP and the filling dielectric pattern VI. The conductive pad PAD may be provided in a space defined by the inner wall of the vertical dielectric pattern VP. For example, the conductive pad PAD may have a sidewall in contact with the inner wall of the vertical dielectric pattern VP. The conductive pad PAD may have a top surface coplanar with that of the vertical dielectric pattern VP.

The first pad PAD1 of the conductive pad PAD may be on (e.g., directly contact/cover) the first and second recessed top surfaces RSt1 and RSt2. The first pad PAD1 may have first and second segments that respectively overlap (e.g., cover) the first and second recessed top surfaces RSt1 and RSt2, and the first segment may be located higher than the second segment. For example, the second segment of the first pad PAD1 may protrude from the first segment toward the semiconductor pattern SP. The first pad PAD1 may have a third recessed top surface RSt3. The third recessed top surface RSt3 may be concave toward the substrate 100.

The second pad PAD2 may be provided on the first pad PAD1 of the conductive pad PAD. The second pad PAD2 may be on (e.g., cover) the third recessed top surface RSt3. An oxide may be interposed between the first pad PAD1 and the second pad PAD2. For example, the first pad PAD1 and the second pad PAD2 may have therebetween a boundary that consists of oxide. The boundary may have the same profile as that of the third recessed top surface RSt3.

The first pad PAD1 and the second pad PAD2 may include the same material. For example, the conductive pad PAD may include silicon (Si), germanium (Ge), or a mixture thereof. The conductive pad PAD may be amorphous. The conductive pad PAD may have a second conductivity type (e.g., n-type).

Referring still to FIGS. 3, 4, and 5, the stack structure ST may be provided thereon with a third dielectric layer IL3 and a fourth dielectric layer IL4 that are sequentially stacked. The fourth dielectric layer IL4 may be provided thereon with bit lines BL that extend in the first direction D1. The bit line BL and the conductive pad PAD may be provided therebetween with a bit-line contact plug BPLG that penetrates the fourth dielectric layer IL4 and the third dielectric layer IL3. The bit line BL may be electrically connected to the vertical channel structure VS through the bit-line contact plug BPLG and the conductive pad PAD.

A semiconductor memory device according to the present embodiment may be configured such that the upper portion of the semiconductor pattern SP may be recessed to have the second recessed top surface RSt2. The conductive pad PAD on the second recessed top surface RSt2 may satisfactorily and completely fill an upper portion of the channel hole CH. Therefore, the conductive pad PAD may be free of process defects, and accordingly the semiconductor device may increase in production yield and improve in reliability.

Figure 9:
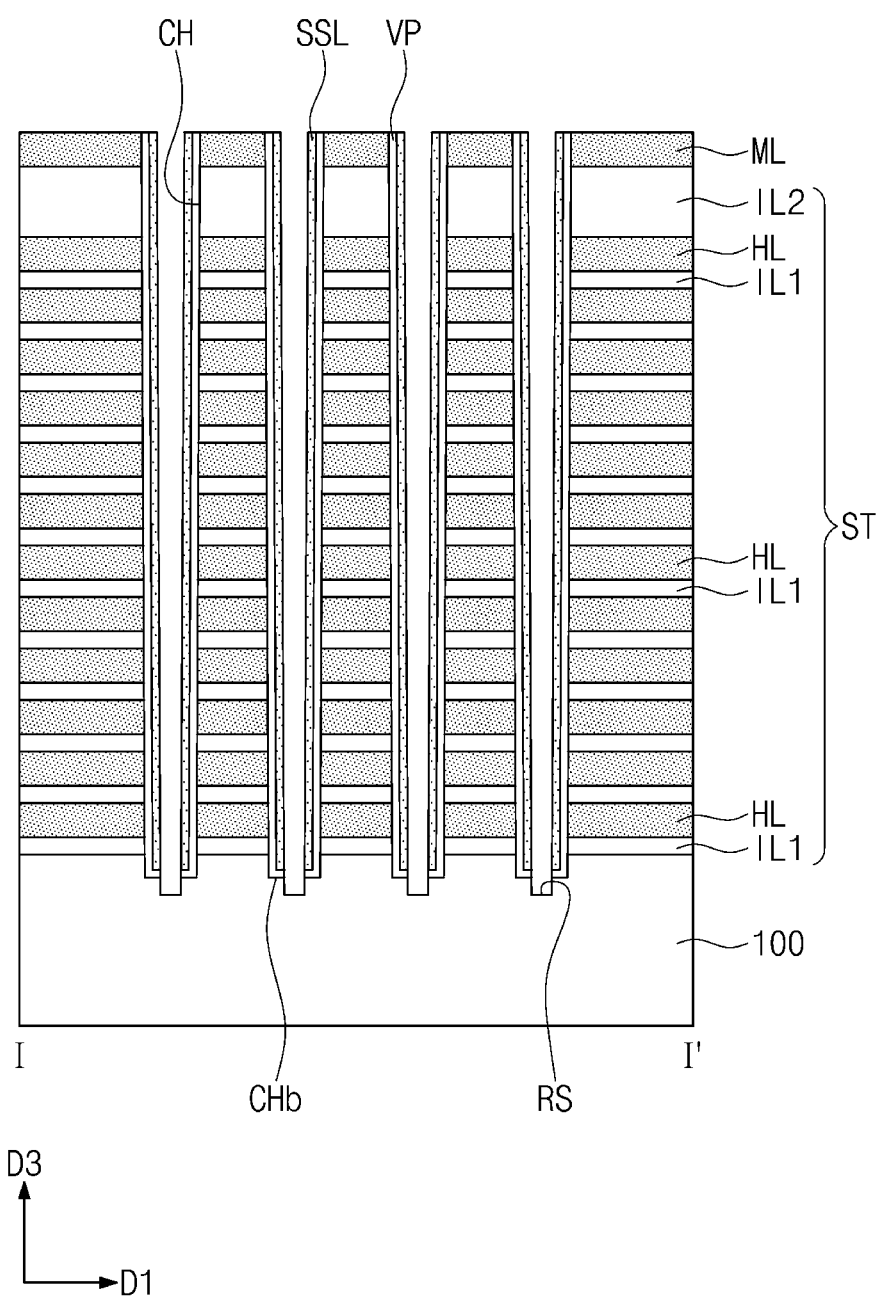
Figure 10:
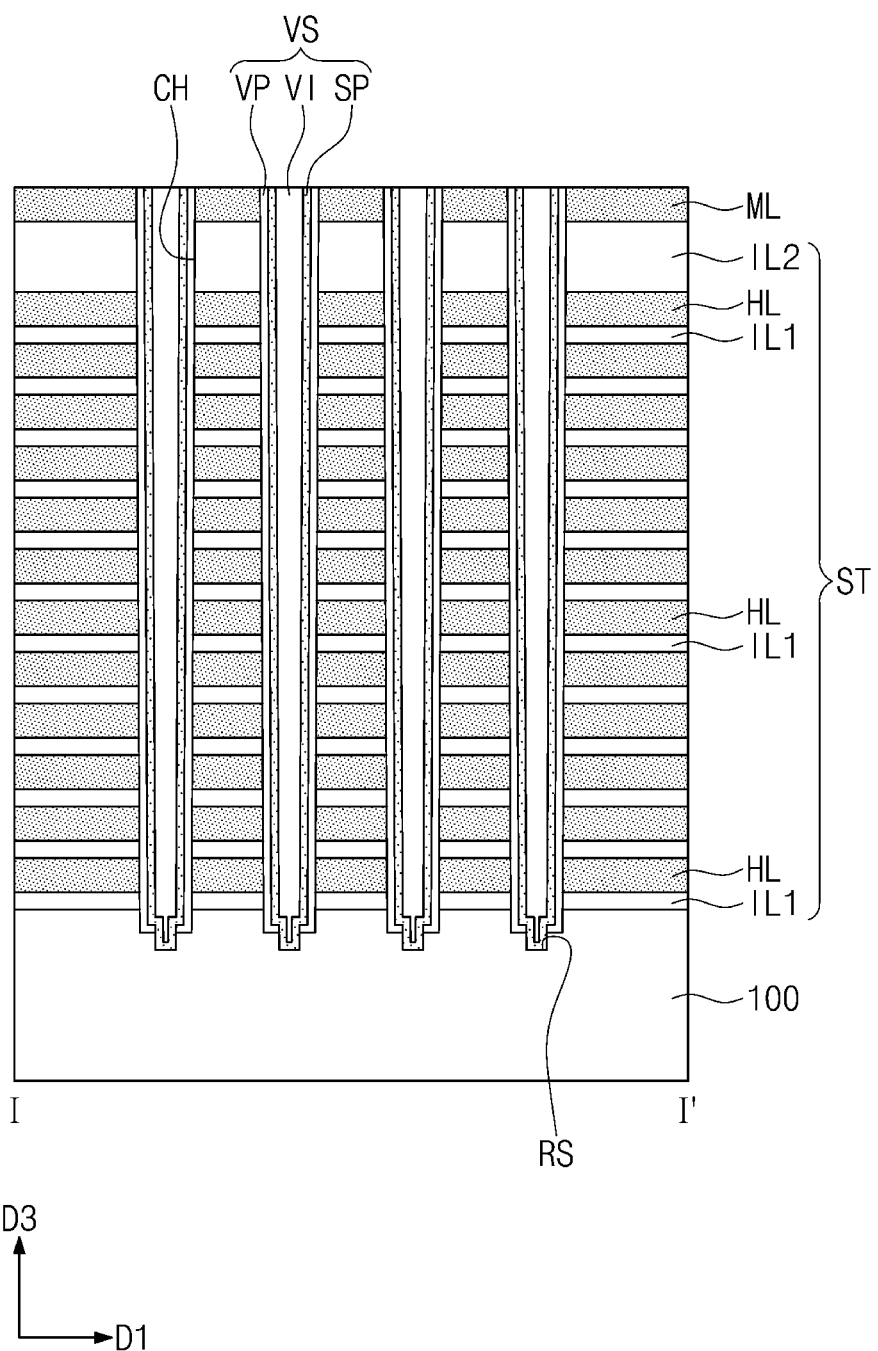
Figure 11:
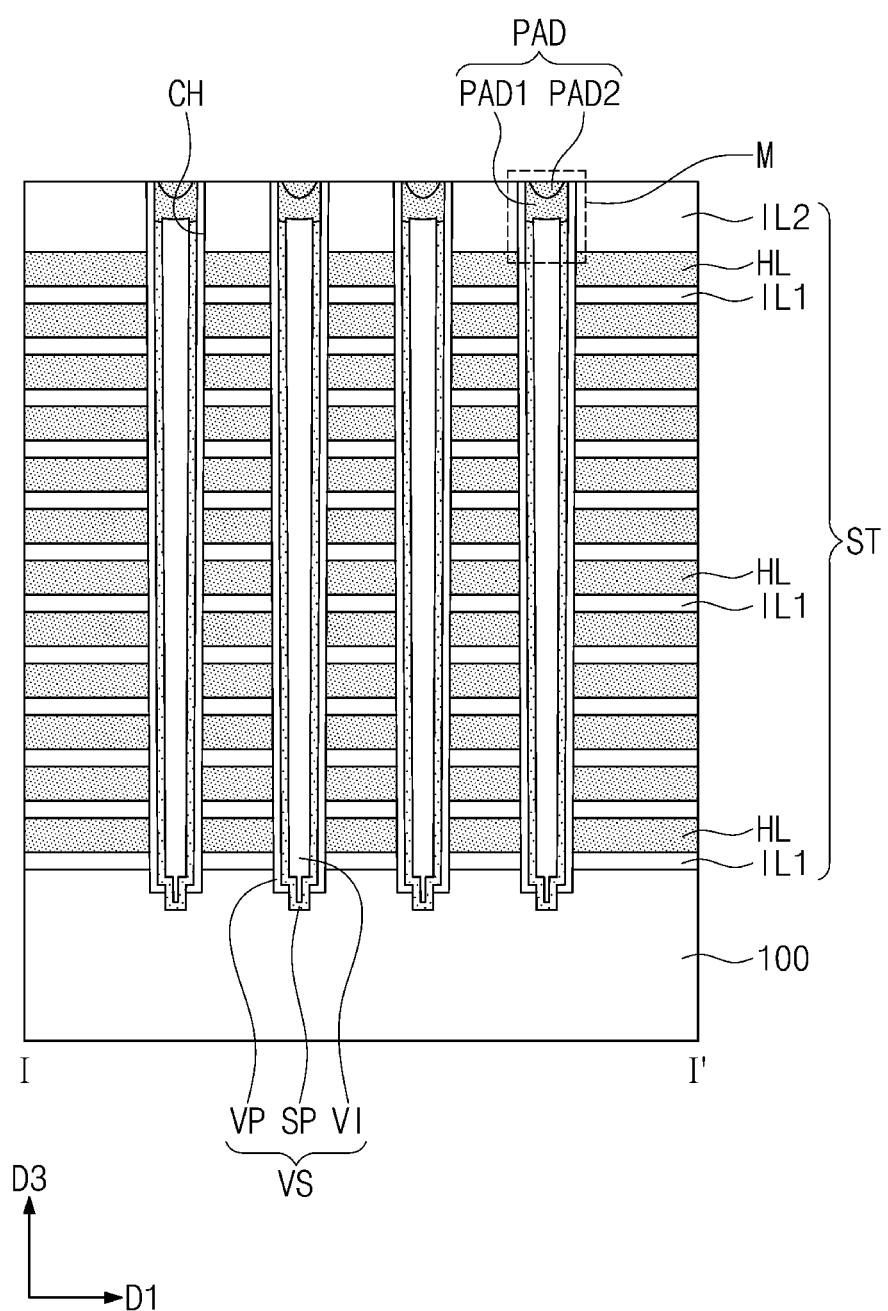

FIGS. 6 to 13 illustrate cross-sectional views taken along line I-I' of FIG. 3, showing a method of fabricating a three-dimensional semiconductor memory device according to some example embodiments of the present inventive concepts. FIGS. 14 to 19 illustrate enlarged cross-sectional views of section M depicted in FIG. 11, showing a method of forming a conductive pad of FIG. 11.

Figure 6:
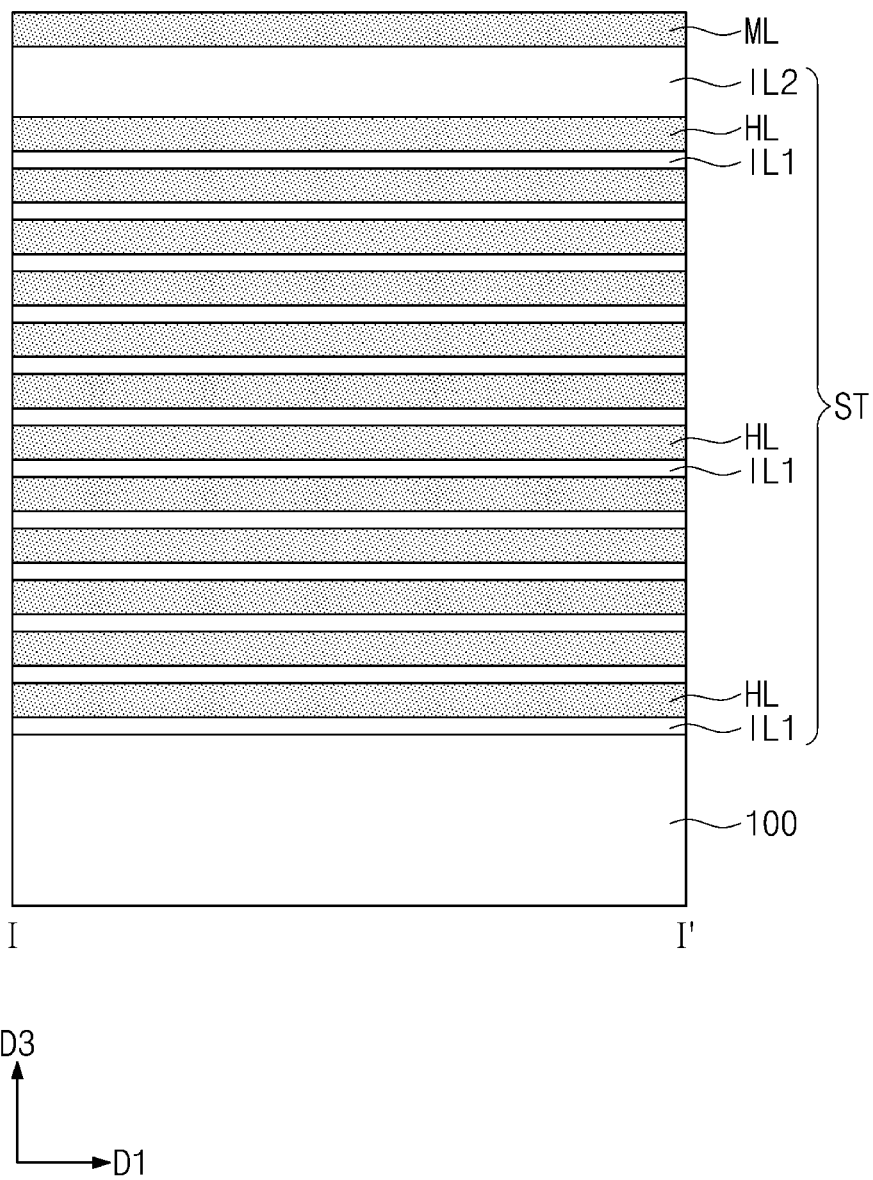
FIGS. 6 to 13 illustrate cross-sectional views taken along line I-I' of FIG. 3, showing a method of fabricating a three-dimensional semiconductor memory device according to some example embodiments of the present inventive concepts.

Referring to FIGS. 3 and 6, a stack structure ST may be formed by vertically and alternately stacking first dielectric layers IL1 and sacrificial layers HL on an entire surface of a substrate 100. The substrate 100 may be a silicon substrate, a germanium substrate, or a silicon-germanium substrate.

The formation of the stack structure ST may further include forming a second dielectric layer IL2 on an uppermost sacrificial layer HL and forming a mask layer ML on the second dielectric layer IL2. The second dielectric layer IL2 may be formed thicker than the first dielectric layer IL1.

The first dielectric layers ILL the sacrificial layers HL, and the second dielectric layer IL2 may be deposited by using thermal chemical vapor deposition (CVD), plasma enhanced CVD, physical CVD, or atomic layer deposition (ALD). The first dielectric layers IL1 and the second dielectric layer IL2 may be formed of a silicon oxide layer. The sacrificial layers HL may be formed of a silicon nitride layer or a silicon oxynitride layer. The mask layer ML may be formed of a silicon nitride layer or a silicon oxynitride layer.

Figure 7:
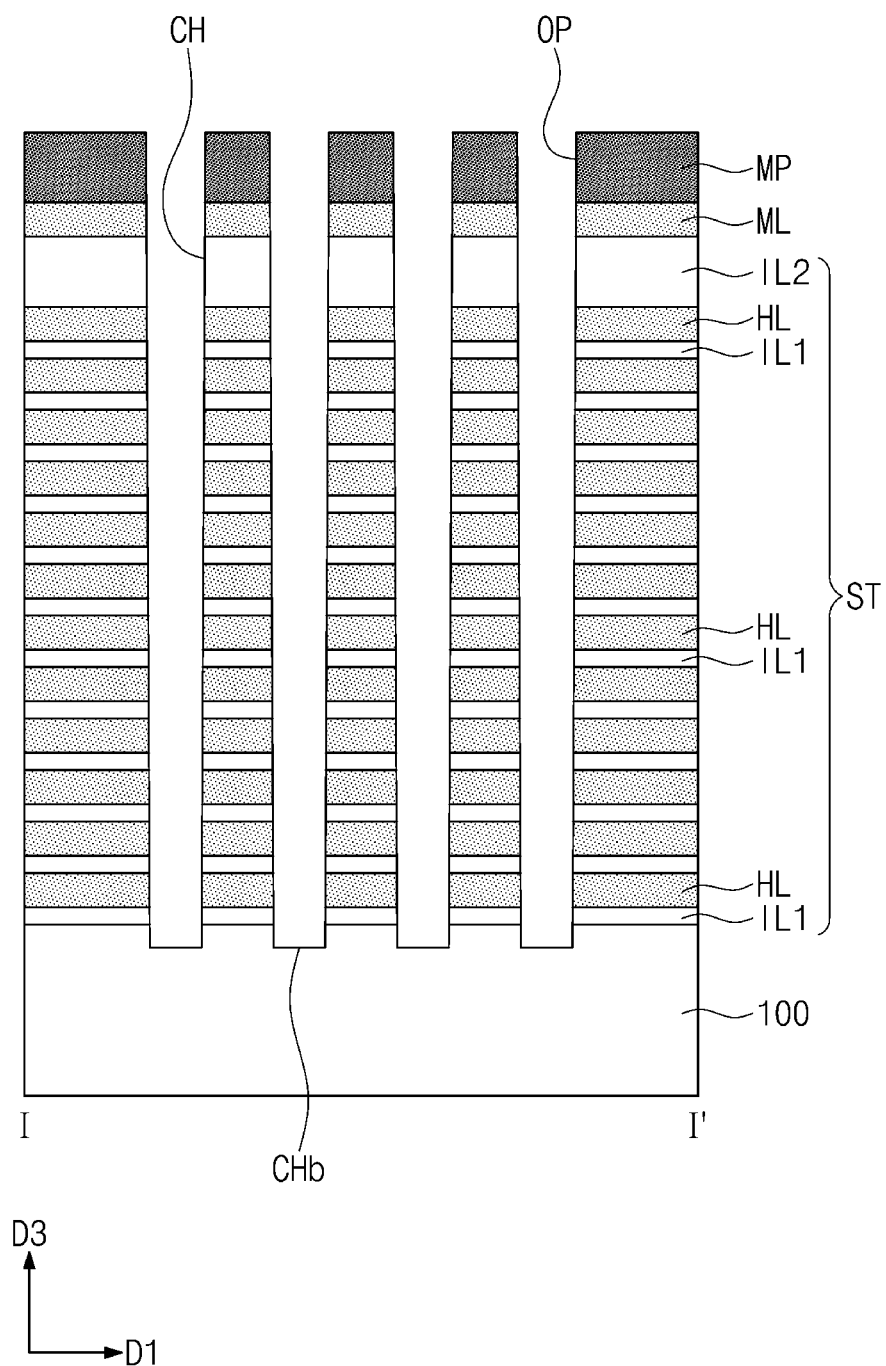

Referring to FIGS. 3 and 7, an upper portion of the stack structure ST may be patterned to form channel holes CH. For example, the formation of the channel holes CH may include forming on the stack structure ST a mask pattern MP having openings OP that define areas where the channel holes CH are formed, and performing an anisotropic etching process in which the mask pattern MP is used as an etching mask to anisotropically etch the stack structure ST.

The channel holes CH may be over-etched during the anisotropic etching process, and thus the channel holes CH may extend into the substrate 100. Each of the channel holes CH may have a bottom CHb lower than a top surface of the substrate 100.

Figure 8:
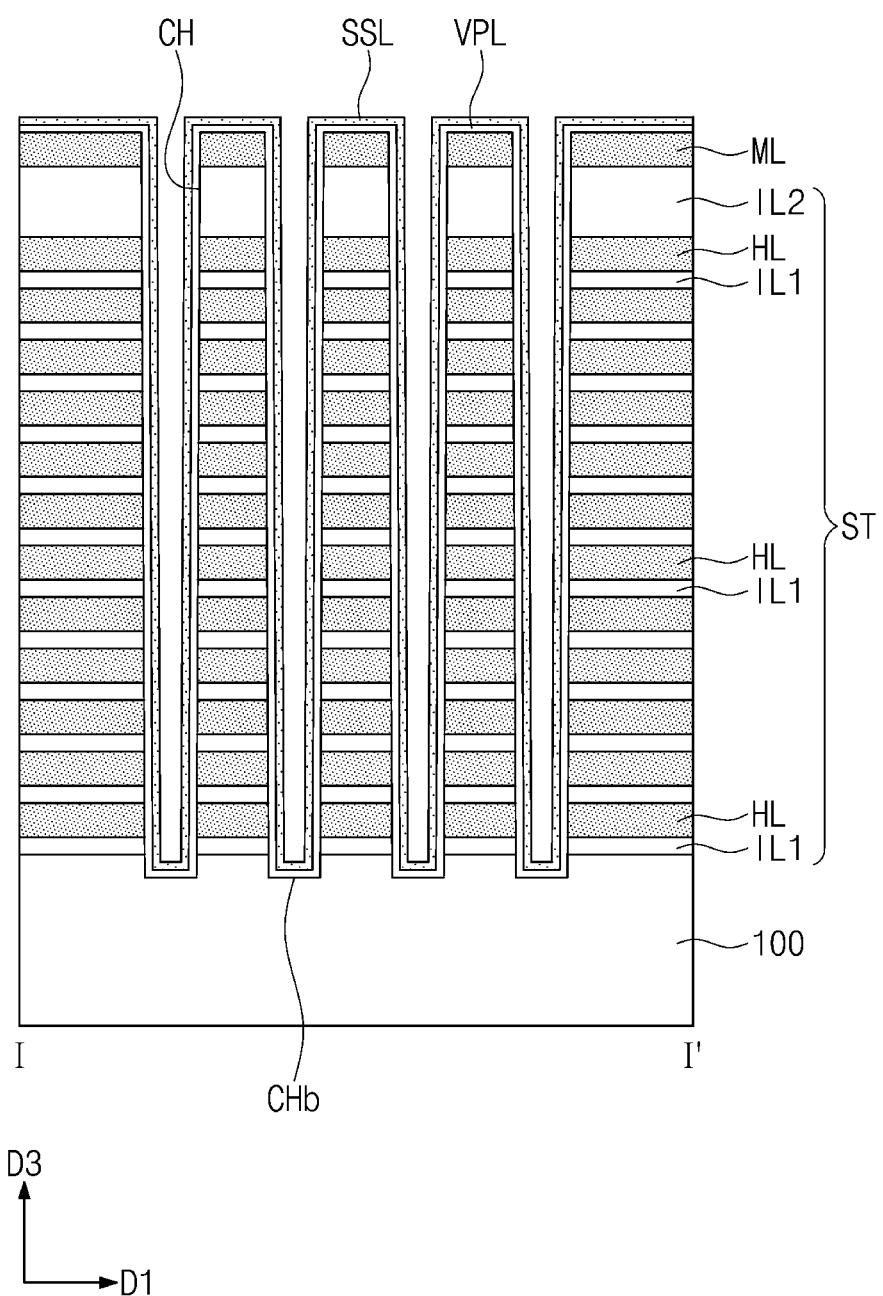

Referring to FIGS. 3 and 8, the mask pattern MP may be selectively removed. A vertical dielectric layer VPL and a sacrificial semiconductor layer SSL may be sequentially formed in the channel holes CH. For example, the formation of the vertical dielectric layer VPL may include conformally forming a blocking dielectric layer on an inner wall of each of the channel holes CH, conformally forming a charge storage layer on the blocking dielectric layer, and conformally forming a tunnel dielectric layer on the charge storage layer. The vertical dielectric layer VPL may cover the bottom CHb of each of the channel holes CH.

For example, the blocking dielectric layer may include a silicon oxide layer. The charge storage layer may include a silicon nitride layer, a silicon oxynitride layer, or a silicon-rich nitride layer. The tunnel dielectric layer may include a silicon oxide layer or a high-k dielectric layer such as an aluminum oxide layer or a hafnium oxide layer. The blocking dielectric layer, the charge storage layer, and the tunnel dielectric layer may be formed by using atomic layer deposition (ALD) or chemical vapor deposition (CVD).

A sacrificial semiconductor layer SSL may be conformally formed on the vertical dielectric layer VPL in each of the channel holes CH. For example, the sacrificial semiconductor layer SSL may include silicon (Si), germanium (Ge), or a mixture thereof. The sacrificial semiconductor layer SSL may be formed by using atomic layer deposition (ALD) or chemical vapor deposition (CVD).

Referring to FIGS. 3 and 9, an anisotropic etching process may be performed on the entire surface of the substrate 100, thereby forming recesses RS that extend from corresponding bottoms CHb of the channel holes CH toward a bottom surface of the substrate 100.

The anisotropic etching process may be performed such that portions of the sacrificial semiconductor layer SSL that are on the inner wall of the channel hole CH may be used as an etching mask to etch portions of the vertical dielectric layer VPL and the sacrificial semiconductor layer SSL that are formed on the bottom CHb of the channel hole CH. The anisotropic etching process may continue until an upper portion of the substrate 100 is over-etched to form the recesses RS.

During the anisotropic etching process, the vertical dielectric layer VPL may be removed from the bottom CHb of the channel hole CH, such that a vertical dielectric pattern VP may be formed to cover the inner wall of the channel hole CH. The recesses RS and the channel holes CH may expose the substrate 100.

Referring to FIGS. 3 and 10, the sacrificial semiconductor layer SSL may be selectively removed. Afterwards, a semiconductor pattern SP may be formed in each of the channel holes CH. A lower portion of the semiconductor pattern SP may fill the recess RS. The lower portion of the semiconductor pattern SP may be directly connected to the substrate 100.

The semiconductor pattern SP may be conformally formed on the vertical dielectric pattern VP in each of the channel holes CH. For example, the semiconductor pattern SP may include silicon (Si), germanium (Ge), or a mixture thereof. The semiconductor pattern SP may be formed by using atomic layer deposition (ALD) or chemical vapor deposition (CVD).

A filling dielectric pattern VI may be formed to completely fill each of the channel holes CH. A vertical channel structure VS may be constituted by the vertical dielectric pattern VP, the semiconductor pattern SP, and the filling dielectric pattern VI that are formed in each of the channel holes CH. After that, a planarization process may be performed until a top surface of the mask layer ML is exposed. Therefore, the vertical channel structure VS may have a top surface coplanar with that of the mask layer ML.

Referring to FIGS. 3 and 11, a conductive pad PAD may be formed in/on an upper portion of each of the channel holes CH. The conductive pad PAD may be formed on the vertical channel structure VS. The formation of the conductive pad PAD will be further discussed in detail with reference to FIGS. 14 to 19.

Figure 14:
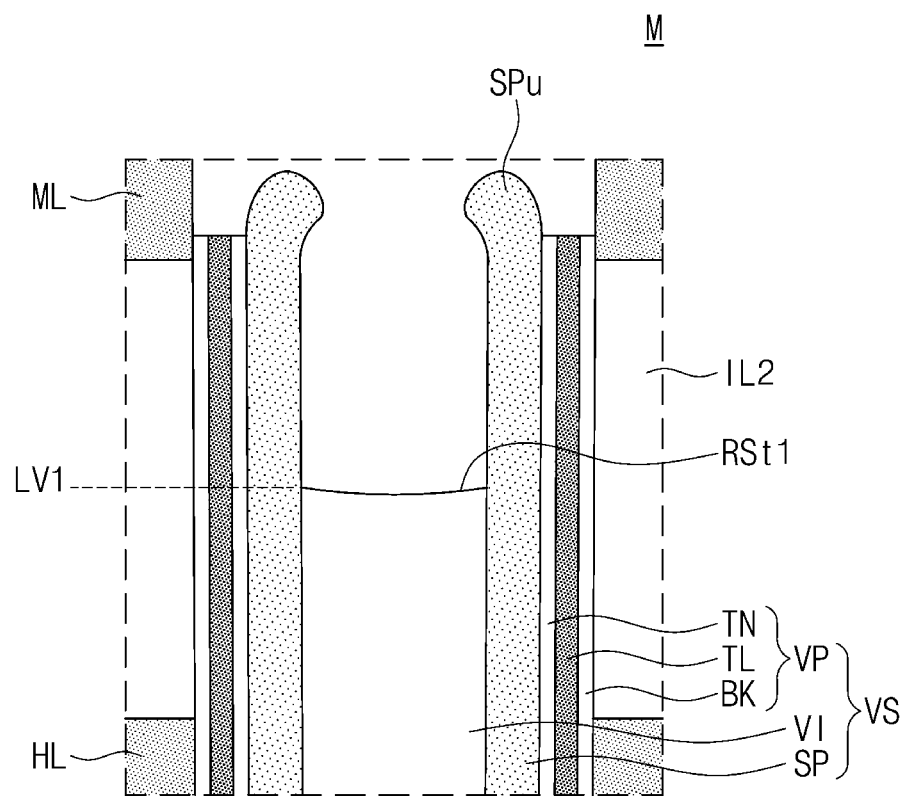
FIGS. 14 to 19 illustrate enlarged cross-sectional views of section M depicted in FIG. 11, showing a method of forming a conductive pad of FIG. 11.

Referring to FIG. 14, a resultant structure of FIG. 10 may experience a first etching process to recess an upper portion of the filling dielectric pattern VI. The first etching process may include a dry or wet etching process that selectively etches oxide. During the first etching process, the filling dielectric pattern VI may be recessed to have a first recessed top surface RSt1. The first recessed top surface RSt1 may have an uppermost part at a first level LV1. The first level LV1 may be lower than a top surface of the second dielectric layer IL2.

An upper portion of the vertical dielectric pattern VP may also be etched during the first etching process. The vertical dielectric pattern VP may, however, be less etched than the filling dielectric pattern VI. Therefore, the vertical dielectric pattern VP may have a top surface at a level higher than that of the top surface of the second dielectric layer IL2.

An upper portion SPu of the semiconductor pattern SP may be exposed after the first etching process. The exposed upper portion SPu of the semiconductor pattern SP may become bent due to the absence of any support layer. When a conductive pad PAD is subsequently deposited in a state where the upper portion SPu still remains on the semiconductor pattern SP, the bent upper portion SPu may cause the incomplete formation of the conductive pad PAD and induce the occurrence of defects such as voids.

Figure 15:
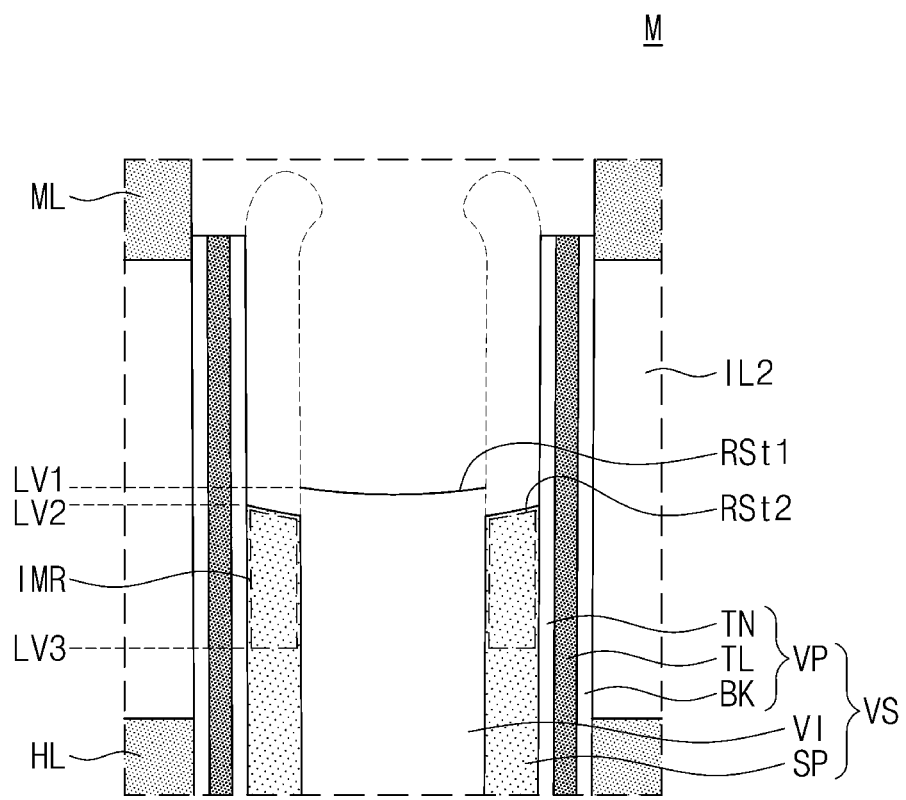

Referring to FIG. 15, a second etching process may be performed to recess the upper portion SPu of the semiconductor pattern SP. The second etching process may include a dry etching process that selectively etches a semiconductor material (e.g., Si, Ge, or SiGe). The second etching process may use a halogen-element-containing etching gas, such as $Cl_2$, HBr, $F_2$, or $ClF_3$.

The upper portion SPu of the semiconductor pattern SP may be removed during the second etching process. During the second etching process, the semiconductor pattern SP may be recessed to have a second recessed top surface RSt2. The second recessed top surface RSt2 may have an uppermost part at a second level LV2. The second level LV2 may be lower than the first level LV1.

During the second etching process, a halogen element (e.g., fluorine (F), chlorine (Cl), and/or bromine (Br)) contained in the etching gas may diffuse into the semiconductor pattern SP. Because the semiconductor pattern SP has a grain boundary between crystals, the halogen element may diffuse into the grain boundary and may be kept in the grain boundary. The halogen element may diffuse into the semiconductor pattern SP, and thus an impurity region IMR may be formed on/in an upper portion of the semiconductor pattern SP. The impurity region IMR may be located directly below the second recessed top surface RSt2.

An atomic percent of the halogen element, or impurity concentration, in the impurity region IMR may fall within a range of 1 at % to 5 at %. The impurity region IMR may have a bottom at a third level LV3. The third level LV3 may be lower than the second level LV2.

Figure 16:
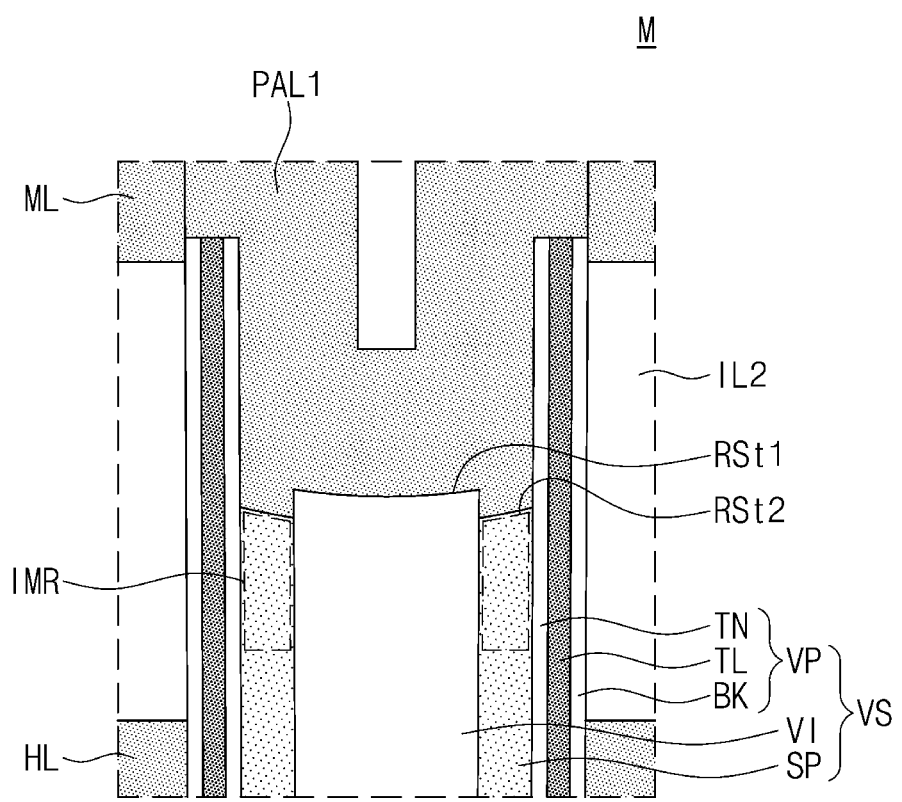

Referring to FIG. 16, a first pad layer PAL1 may be formed on the first and second recessed top surfaces RSt1 and RSt2. The first pad layer PAL1 may be formed on (e.g., to cover) the vertical dielectric pattern VP and the mask layer ML. The first pad layer PAL1 may include silicon (Si), germanium (Ge), or a mixture thereof. The first pad layer PAL1 may be formed by using chemical vapor deposition (CVD) or atomic layer deposition (ALD).

Figure 17:
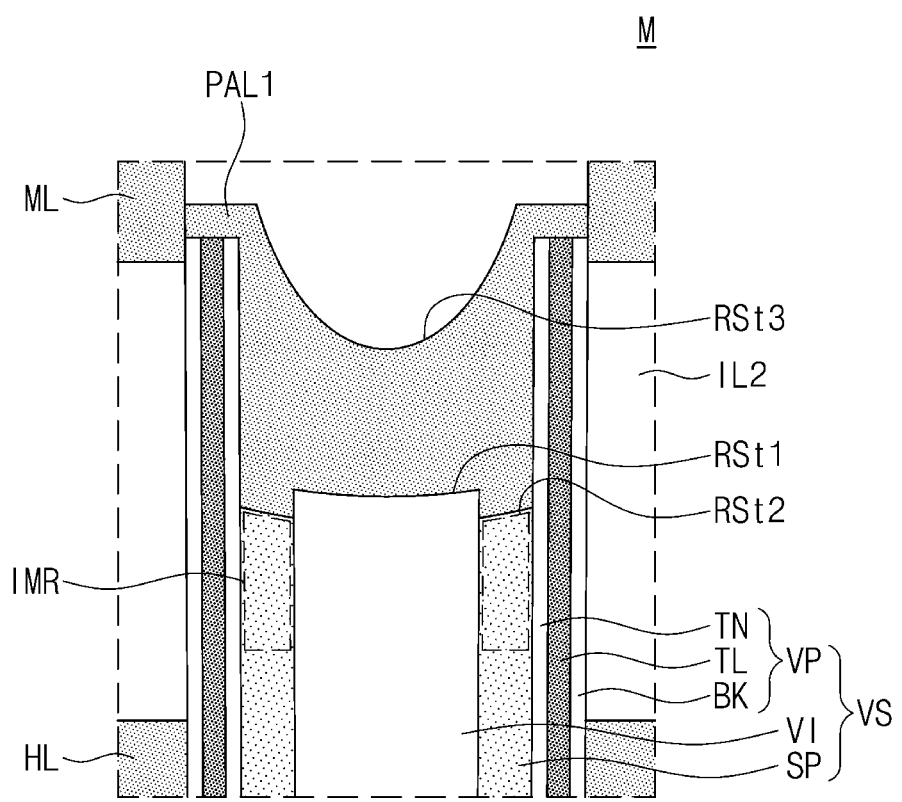

Referring to FIG. 17, a third etching process may be performed to recess an upper portion of the first pad layer PAL1. The third etching process may include a wet or dry etching process that selectively etches a semiconductor material (e.g., Si, Ge, or SiGe). During the third etching process, the first pad layer PAL1 may be recessed to have a third recessed top surface RSt3. The third recessed top surface RSt3 may be concave toward the substrate 100.

Figure 18:
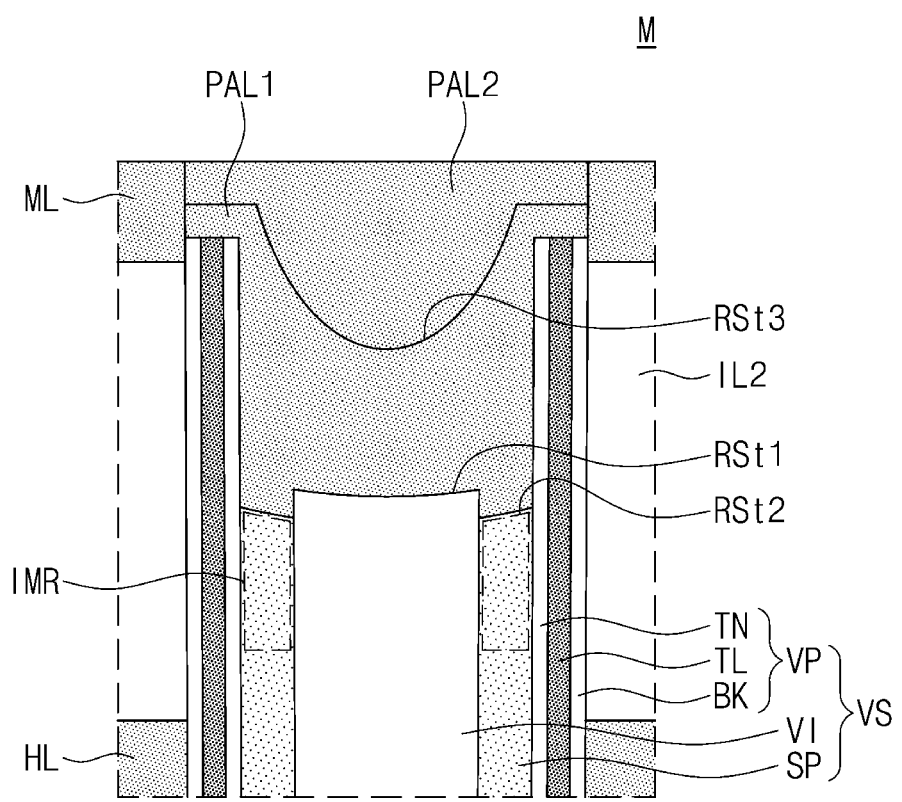

Referring to FIG. 18, a second pad layer PAL2 may be formed on the first pad layer PAL1. The second pad layer PAL2 may be formed to cover the third recessed top surface RSt3. The second pad layer PAL2 may include the same semiconductor material as that of the first pad layer PAL1. The second pad layer PAL2 may be formed by using atomic layer deposition (ALD) or chemical vapor deposition (CVD).

Before the formation of the second pad layer PAL2, an oxide may be formed on the third recessed top surface RSt3 of the first pad layer PAL1. In this case, a boundary consisting of oxide may be formed between the first pad layer PAL1 and the second pad layer PAL2.

According to some embodiments of the present inventive concepts, the processes from the second etching process of FIG. 15 to the deposition process for the second pad layer PAL2 of FIG. 18 may be performed in-situ in a single processing facility. For example, the processes from the second etching process of FIG. 15 to the deposition process for the second pad layer PAL2 of FIG. 18 may be sequentially performed without vacuum break. Accordingly, impurities such as oxygen (O), carbon (C), and/or nitrogen (N) may be absent between the first pad layer PAL1 and the second recessed top surface RSt2 of the semiconductor pattern SP.

According to other embodiments of the present inventive concepts, the second etching process of FIG. 15 may be performed ex-situ in a different processing facility from that in which are performed the processes from the deposition process for the first pad layer PAL1 of FIG. 16 to the deposition process for the second pad layer PAL2 of FIG. 18. For example, after the second etching process of FIG. 15, an entire surface of the substrate 100 may be exposed to air. In this case, impurities such as oxygen (O), carbon (C), and/or nitrogen (N) may be additionally present between the first pad layer PAL1 and the second recessed top surface RSt2 of the semiconductor pattern SP. For example, the impurity region IMR may further contain at least one impurity selected from the group consisting of oxygen (O), carbon (C), and nitrogen (N).

Figure 19:
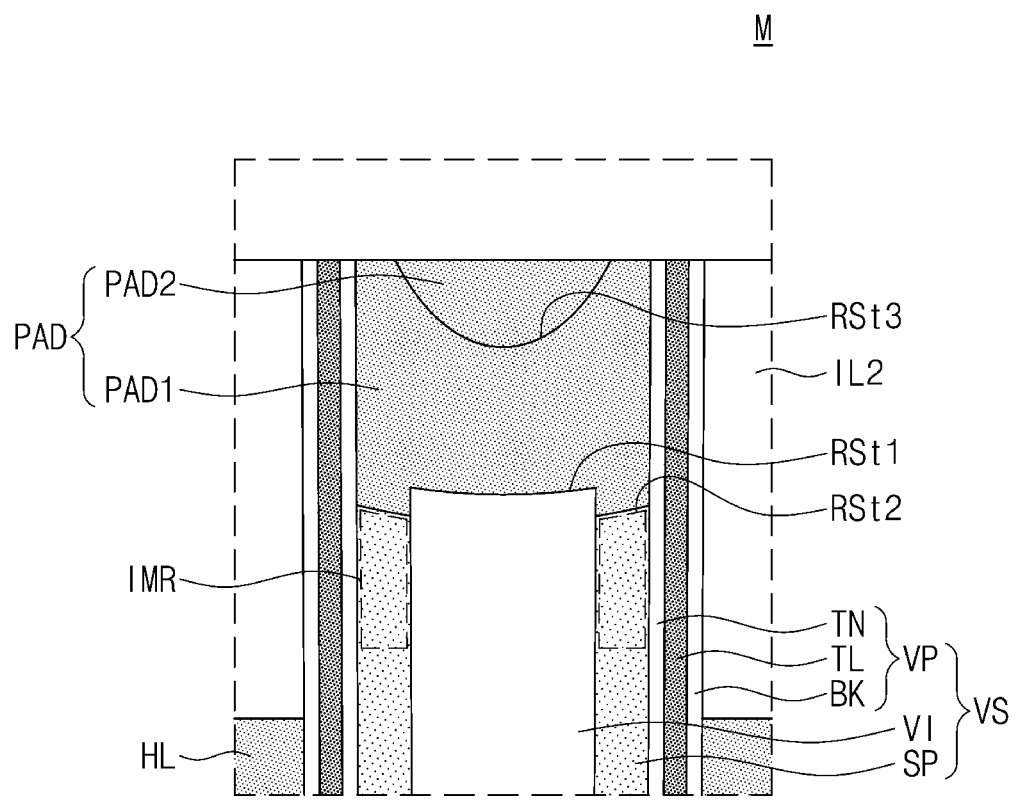

Referring to FIG. 19, a planarization process may be performed until the top surface of the second dielectric layer IL2 is exposed. Therefore, the first and second pad layers PAL1 and PAL2 may be respectively formed into first and second pads PAD1 and PAD2. The first and second pads PAD1 and PAD2 may constitute a conductive pad PAD. During the planarization process, the mask layer ML may be completely removed. The planarization process may cause the vertical dielectric pattern VP and the conductive pad PAD to have their top surfaces coplanar with that of the second dielectric layer IL2.

Figure 12:
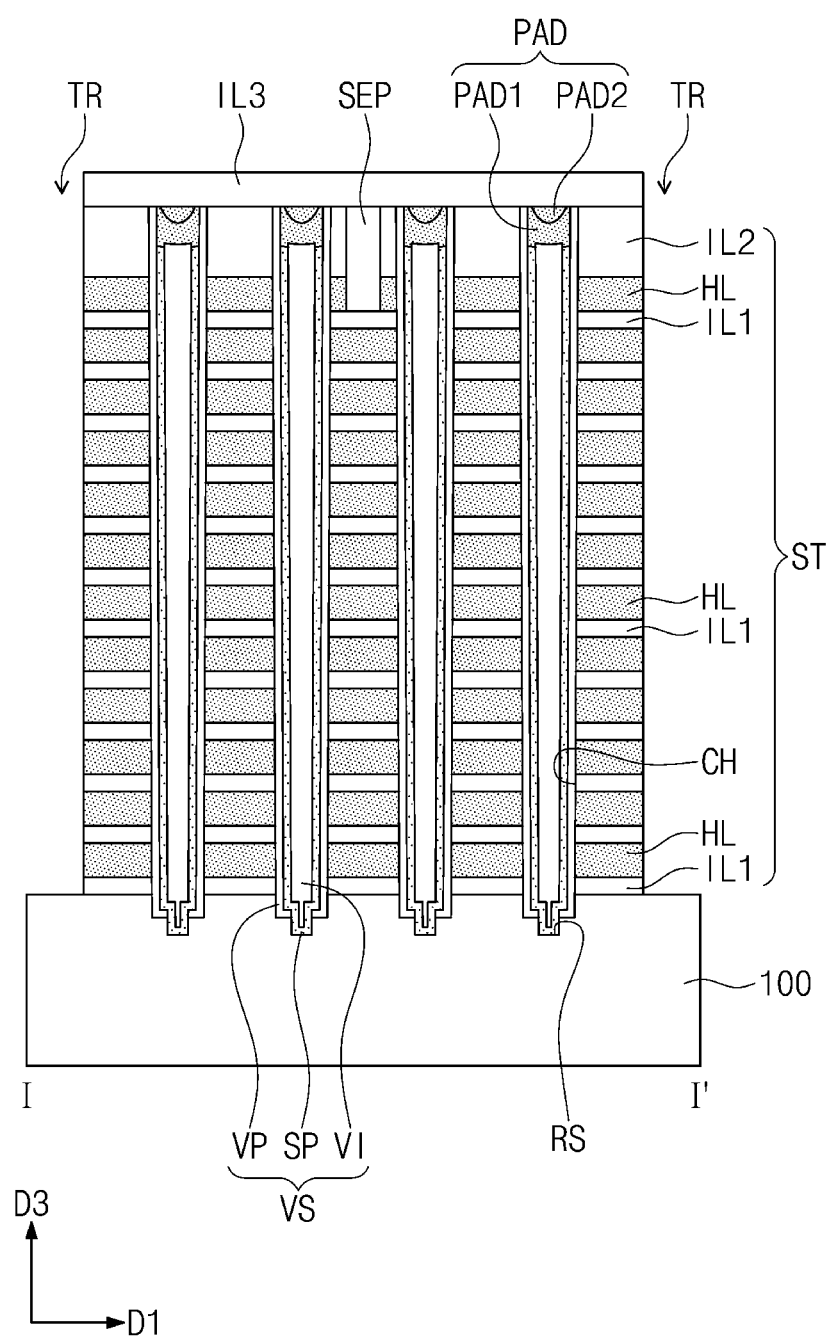

Referring to FIGS. 3 and 12, a separation dielectric pattern SEP may be formed in an upper portion of the stack structure ST. The separation dielectric pattern SEP may be formed to extend in the second direction D2. For example, the formation of the separation dielectric pattern SEP may include forming a recess by etching the second dielectric layer IL2 and an uppermost sacrificial layer HL, and filling the recess with a dielectric layer.

A third dielectric layer IL3 may be formed on the stack structure ST. The third dielectric layer IL3 may cover the conductive pads PAD and the separation dielectric pattern SEP. The third dielectric layer IL3 and the stack structure ST may be patterned to form trenches TR that penetrate the stack structure ST. The trenches TR may partially expose the substrate 100. The trenches TR may extend in the second direction D2 along the stack structure ST.

Figure 13:
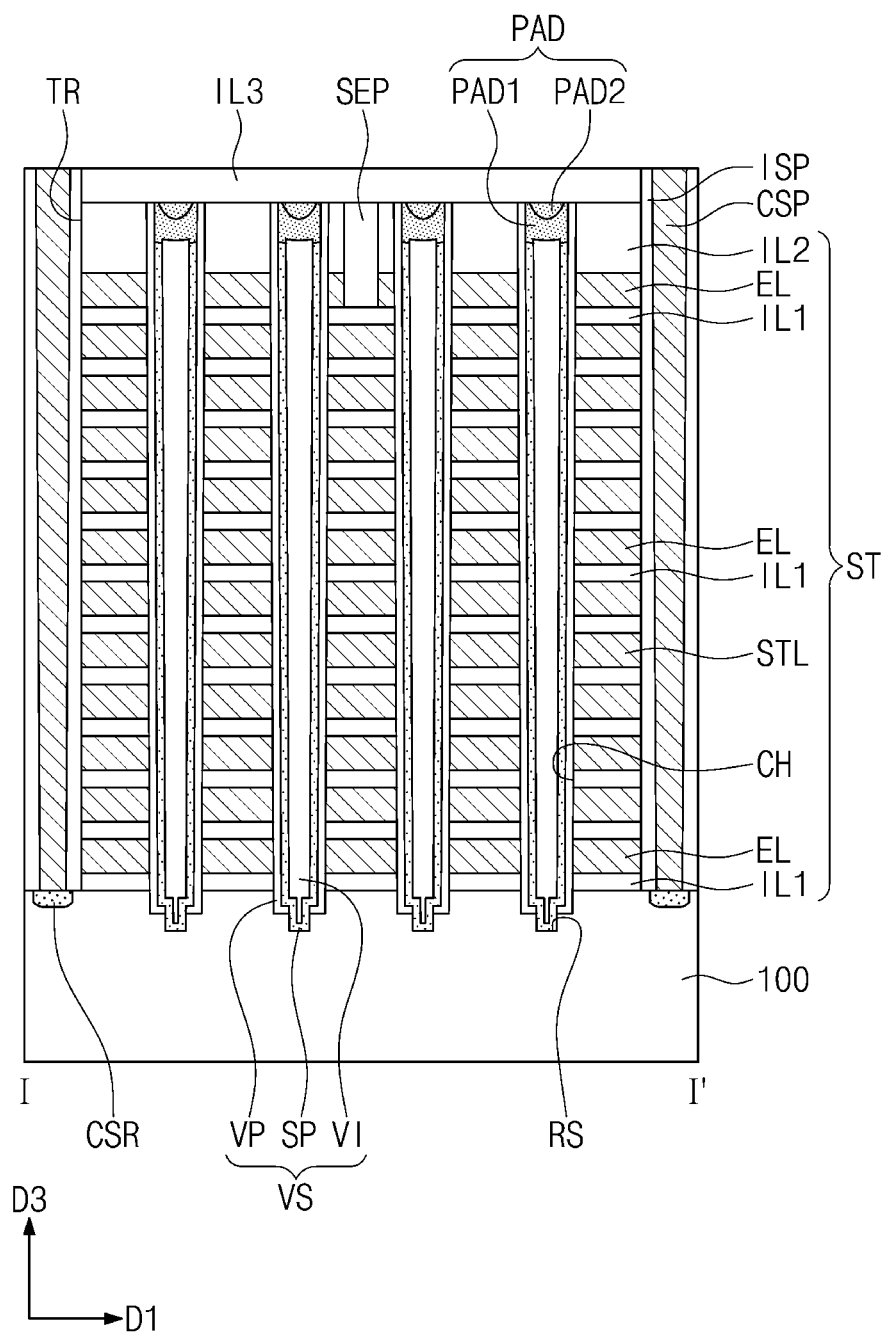

Referring to FIGS. 3 and 13, the sacrificial layers HL may be replaced with corresponding electrodes EL. For example, the sacrificial layers HL exposed to the trenches TR may be selectively removed to form empty spaces. The removal of the sacrificial layers HL may use a wet etching process capable of selectively etching the sacrificial layers HL. A conductive material may be deposited on the substrate 100, thereby filling the empty spaces where the sacrificial layers HL are removed. The conductive material may be selected from doped semiconductors, metals, and transition metals. The electrode EL may be formed from the conductive material that fills the empty space.

The portions of the substrate 100 that are exposed to the trenches TR may be doped with impurities to form common source regions CSR. A dielectric spacer ISP and a common source plug CSP may be formed to sequentially fill each of the trenches TR. The common source plug CSP may be coupled to the common source region CSR.

Referring back to FIGS. 3 and 4, a fourth dielectric layer IL4 may be formed on the third dielectric layer IL3. Bit-line contact plugs BPLG may be formed which penetrate the third and fourth dielectric layers IL3 and IL4 and which are coupled to corresponding conductive pads PAD. On the fourth dielectric layer IL4, bit lines BL may be formed to have electrical connection with the bit-line contact plugs BPLG.

In a fabrication method according to some embodiments of the present inventive concepts, the upper portion SPu of the semiconductor pattern SP may be recessed before the conductive pad PAD is formed, such that it may be possible to inhibit/prevent the occurrence of process defects, such as voids, caused by an instance in which the conductive pad PAD does not completely fill the upper portion of the channel hole CH. Consequently, a semiconductor device may increase in production yield and improve in reliability.

FIGS. 20 to 23 illustrate enlarged cross-sectional views of section M depicted in FIG. 4, showing a three-dimensional semiconductor memory device according to some example embodiments of the present inventive concepts. In the embodiments that follow, a detailed description of technical features repetitive to those discussed above with reference to FIGS. 3, 4, and 5 may be omitted, and a difference thereof will be discussed in detail.

Figure 20:
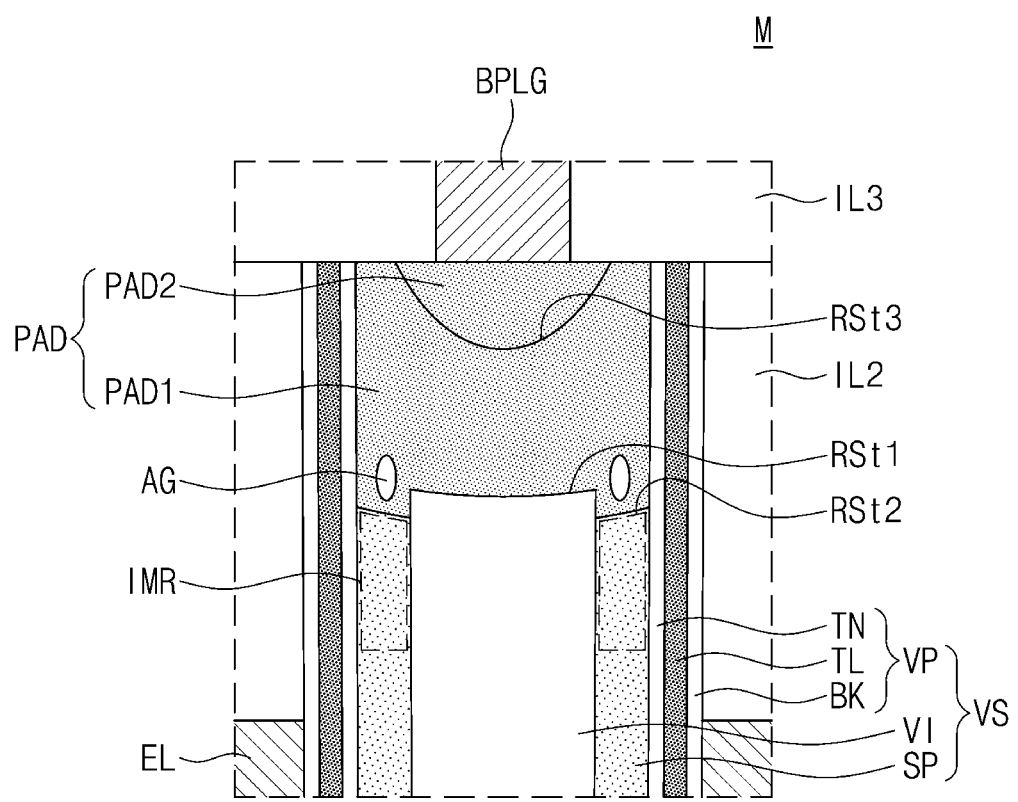
FIGS. 20 to 23 illustrate enlarged cross-sectional views of section M depicted in FIG. 4, showing a three-dimensional semiconductor memory device according to some example embodiments of the present inventive concepts.

As an embodiment of the present inventive concepts, referring to FIGS. 3, 4, and 20, the first pad PAD1 may include at least one gap AG, such as an air gap. The gap AG may be any void or gap, and is not necessarily filled with air. The gap AG may be adjacent to the second recessed top surface RSt2. When the first pad PAD1 is formed, the gap AG may be created due to a difference in height between the first recessed top surface RSt1 and the second recessed top surface RSt2.

Figure 21:
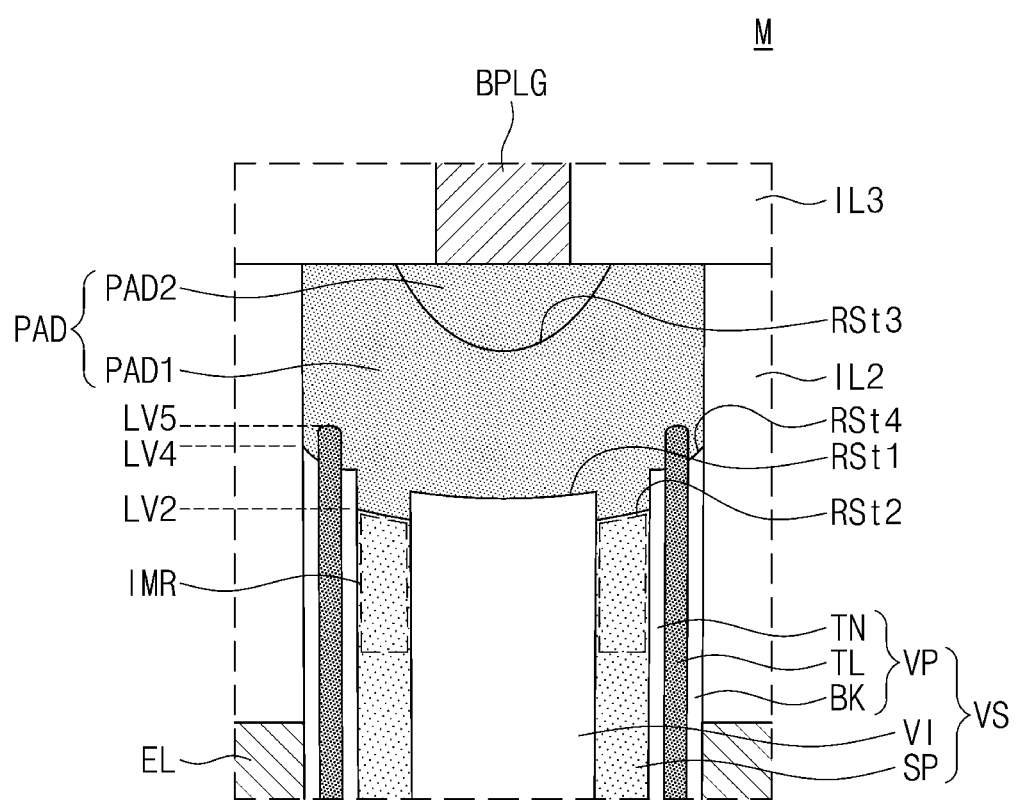

As an embodiment of the present inventive concepts, referring to FIGS. 3, 4, and 21, the vertical dielectric pattern VP may have a fourth recessed top surface RSt4. Because the vertical dielectric pattern VP is recessed, the first pad PAD1 may have a sidewall in contact with an inner wall of the second dielectric layer IL2 (or the inner wall of the channel hole CH).

The top surface of the blocking dielectric layer BK may be higher than the top surface of the tunnel dielectric layer TN. The top surface of the blocking dielectric layer BK may have an uppermost part at a fourth level LV4. The top surface of the charge storage layer TL may be higher than the top surface of the blocking dielectric layer BK. The top surface of the charge storage layer TL may have an uppermost part at a fifth level LV5. The fourth level LV4 may be higher than the second level LV2. The fifth level LV5 may be higher than the fourth level LV4.

The charge storage layer TL may have an etching resistance greater than those of the blocking dielectric layer BK and the tunnel dielectric layer TN. Therefore, even when the vertical dielectric pattern VP is recessed, the top surface of the charge storage layer TL may be located higher than the top surfaces of the blocking dielectric layer BK and the tunnel dielectric layer TN.

Figure 22:
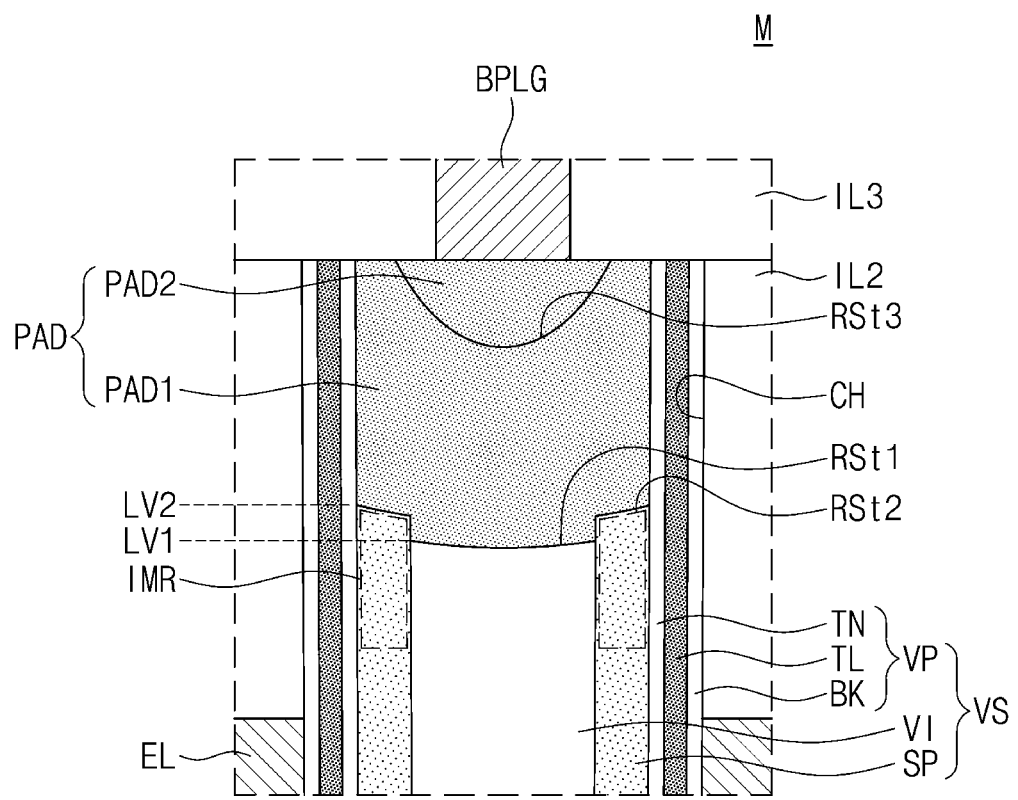

As an embodiment of the present inventive concepts, referring to FIGS. 3, 4, and 22, the second recessed top surface RSt2 of the semiconductor pattern SP may be higher than the first recessed top surface RSt1 of the filling dielectric pattern VI. For example, the second level LV2 at which is located the uppermost part of the second recessed top surface RSt2 may be higher than the first level LV1 at which is located the uppermost part of the first recessed top surface RSt1. When the semiconductor pattern SP is relatively less recessed than the filling dielectric pattern VI, the second recessed top surface RSt2 may become higher than the first recessed top surface RSt1.

Figure 23:
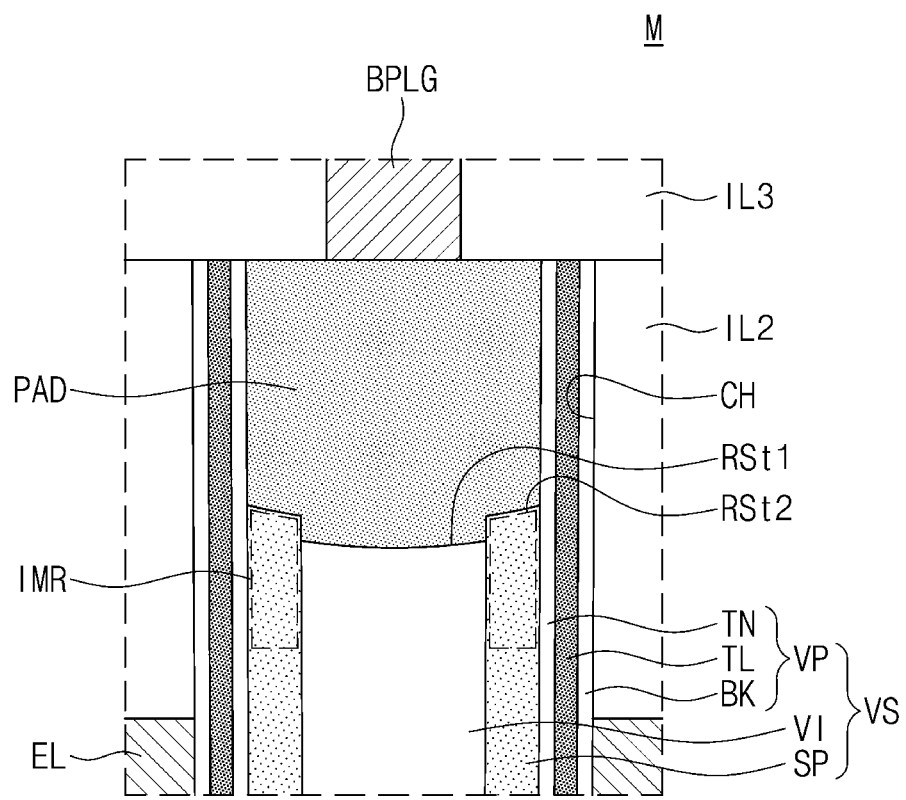

As an embodiment of the present inventive concepts, referring to FIGS. 3, 4, and 23, the conductive pad PAD may be formed of a single conductive layer. For example, differently from the example shown in FIG. 5, the conductive pad PAD according to the present embodiment may not be divided into the first pad PAD1 and the second pad PAD2. The conductive pad PAD may directly cover the first recessed top surface RSt1 of the filling dielectric pattern VI and the second recessed top surface RSt2 of the semiconductor pattern SP. The top surface of the conductive pad PAD may be coplanar with the top surface of the vertical dielectric pattern VP. The top surface of the conductive pad PAD may be coplanar with the top surface of the second dielectric layer IL2.

Figure 24:
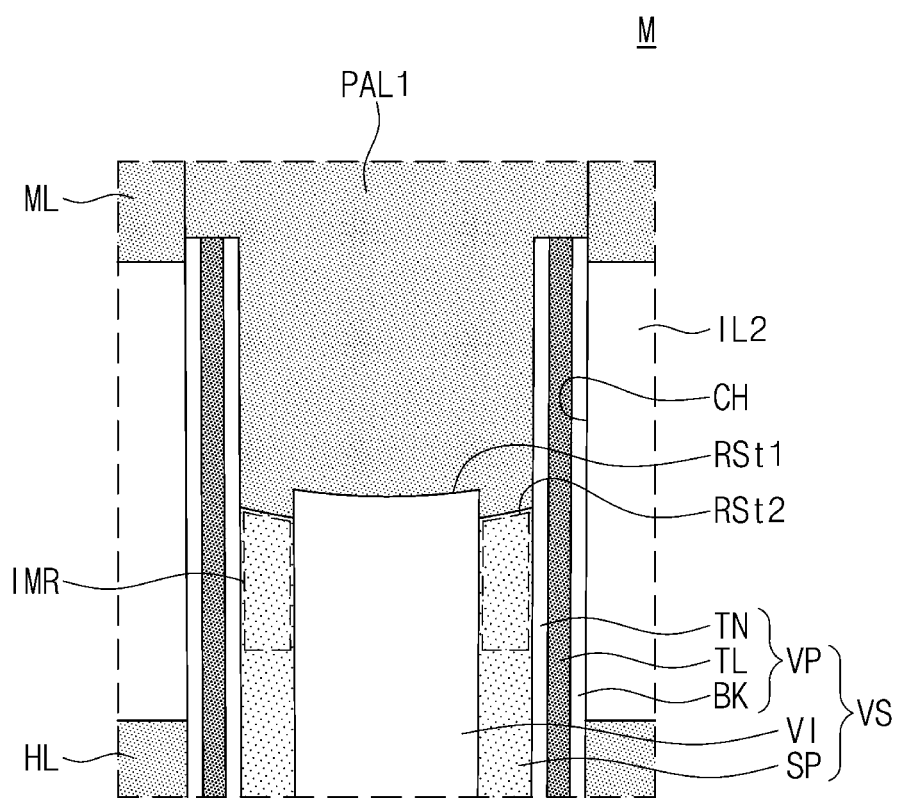
FIG. 24 illustrates an enlarged cross-sectional view of section M depicted in FIG. 11, showing a method of forming a conductive pad of FIG. 23.

FIG. 24 illustrates an enlarged cross-sectional view of section M depicted in FIG. 11, showing a method of forming a conductive pad of FIG. 23. Referring to FIG. 24, the first pad layer PAL1 may be formed on a resultant structure of FIG. 15. The first pad layer PAL1 may be formed to cover the vertical dielectric pattern VP and the mask layer ML. The first pad layer PAL1 may be formed to completely fill an upper portion of the channel hole CH. Subsequently, the first pad layer PAL1 may experience a planarization process to form the conductive pad PAD.

A semiconductor memory device according to some example embodiments of the present inventive concepts may include a semiconductor pattern whose upper portion is recessed. An upper portion of a channel hole may be satisfactorily and completely filled with a conductive pad formed on the recessed semiconductor pattern. Accordingly, the conductive pad may be free of process defects, which may result in an increase in production yield of semiconductor devices and in an improvement in reliability of semiconductor devices.

Although the present invention has been described in connection with some example embodiments of the present inventive concepts illustrated in the accompanying drawings, it will be understood by those skilled in the art that various changes and modifications may be made without departing from the scope of the present inventive concepts.

What is claimed is:

1. A semiconductor memory device comprising:
a stack structure that includes a plurality of electrodes and a plurality of dielectric layers that are alternately stacked on a substrate;
a vertical channel structure that penetrates the stack structure; and
a conductive pad on the vertical channel structure,
wherein the vertical channel structure includes a semiconductor pattern and a vertical dielectric layer between the semiconductor pattern and the electrodes,
wherein an upper portion of the semiconductor pattern includes an impurity region that includes a halogen element, the upper portion being adjacent to the conductive pad, and
wherein the upper portion of the semiconductor pattern has a top surface that slopes downward away from the vertical dielectric layer to a first level that is above a second level of a top surface of an uppermost one of the electrodes.

2. The semiconductor memory device of claim 1,
wherein the vertical channel structure further includes a filling dielectric pattern,
wherein the semiconductor pattern is between the vertical dielectric layer and a sidewall of the filling dielectric pattern,
wherein the top surface of the upper portion of the semiconductor pattern slopes downward toward the sidewall of the filling dielectric pattern, and
wherein the filling dielectric pattern has a top surface that is lower than a top surface of the vertical dielectric layer.

3. The semiconductor memory device of claim 2,
wherein the top surface of the semiconductor pattern is lower than the top surface of the vertical dielectric layer, and
wherein the conductive pad is on the top surface of the filling dielectric pattern and on the top surface of the semiconductor pattern.

4. The semiconductor memory device of claim 3, wherein the conductive pad is on an upper portion of the sidewall of the filling dielectric pattern, the upper portion of the sidewall protruding upward beyond the top surface of the semiconductor pattern.

5. The semiconductor memory device of claim 3,
wherein an uppermost part of the top surface of the filling dielectric pattern is at a third level,
wherein an uppermost part of the top surface of the semiconductor pattern is at a fourth level, and
wherein the fourth level is lower than the third level.

6. The semiconductor memory device of claim 3, wherein the conductive pad includes a gap adjacent to the top surface of the semiconductor pattern.

7. The semiconductor memory device of claim 3,
wherein an uppermost part of the top surface of the filling dielectric pattern is at a third level,
wherein an uppermost part of the top surface of the semiconductor pattern is at a fourth level, and
wherein the fourth level is higher than the third level.

8. The semiconductor memory device of claim 1,
wherein the halogen element includes at least one of fluorine (F), chlorine (Cl), or bromine (Br), and
wherein an atomic percent of the halogen element in the impurity region is in a range of 1 at % to 5 at %.

9. The semiconductor memory device of claim 1,
wherein the conductive pad includes a first pad and a second pad on the first pad,
wherein the second pad is on a top surface of the first pad, and
wherein the semiconductor memory device further comprises an oxide boundary between the second pad and the top surface of the first pad.

10. The semiconductor memory device of claim 1, wherein the impurity region further includes an oxygen (O) impurity, a carbon (C) impurity, or a nitrogen (N) impurity.

11. A semiconductor memory device comprising:
a stack structure that includes a plurality of electrodes and a plurality of dielectric layers that are alternately stacked on a substrate;

a vertical channel structure that penetrates the stack structure; and a conductive pad on the vertical channel structure, wherein the vertical channel structure includes a filling dielectric pattern, a semiconductor pattern, and a vertical dielectric layer that is between the semiconductor pattern and the electrodes, wherein the semiconductor pattern is between the vertical dielectric layer and the filling dielectric pattern, wherein the filling dielectric pattern has a top surface that is lower than a top surface of the vertical dielectric layer, wherein the semiconductor pattern has a top surface that is lower than the top surface of the vertical dielectric layer, wherein an uppermost part of the top surface of the filling dielectric pattern is at a first level, wherein an uppermost part of the top surface of the semiconductor pattern is at a second level, wherein the first level and the second level are different from each other, wherein the conductive pad includes a first pad and a second pad on the first pad, and wherein the second pad is on a concave top surface of the first pad.

12. The semiconductor memory device of claim 11, wherein an upper portion of the semiconductor pattern includes an impurity region that includes at least one halogen element including fluorine (F), chlorine (Cl), or bromine (Br), the upper portion being adjacent to the conductive pad.

13. The semiconductor memory device of claim 12,
wherein a bottom of the impurity region is at a third level, and
wherein a distance from the second level to the third level is in a range of 100 Angstroms (Å) to 1,000 Å, and
wherein a distance from the first level to the second level is in a range of 10 Å to 200 Å.

14. The semiconductor memory device of claim 11, wherein the top surface of the filling dielectric pattern is concave toward the substrate.

15. The semiconductor memory device of claim 11,
wherein the vertical dielectric layer includes a blocking dielectric layer, a charge storage layer, and a tunnel dielectric layer,
wherein the charge storage layer is between the blocking dielectric layer and the tunnel dielectric layer, and
wherein an uppermost part of a top surface of the charge storage layer is at a level higher than a level of an uppermost part of a top surface of the blocking dielectric layer.

16. A semiconductor memory device comprising:
a stack structure on a substrate;
a vertical channel structure that penetrates the stack structure, the vertical channel structure including a filling dielectric pattern, a semiconductor pattern, and a vertical dielectric layer that is between the semiconductor pattern and the stack structure;
a conductive pad on the vertical channel structure and electrically connected to the semiconductor pattern; and
a bit line electrically connected to the conductive pad,
wherein the stack structure includes: a plurality of electrodes and a plurality of first dielectric layers that are alternately stacked on the substrate; and a second dielectric layer on an uppermost one of the electrodes,
wherein the vertical dielectric layer includes a blocking dielectric layer, a charge storage layer, and a tunnel dielectric layer,
wherein the charge storage layer is between the blocking dielectric layer and the tunnel dielectric layer,
wherein a top surface of the filling dielectric pattern is at a level different from a level of a top surface of the semiconductor pattern,
wherein the conductive pad includes a first pad and a second pad on the first pad,
wherein the first pad is on the top surface of the filling dielectric pattern and the top surface of the semiconductor pattern,
wherein the first pad has a top surface that is concave toward the substrate,
wherein the second pad is on the top surface of the first pad, and
wherein a top surface of the second pad is coplanar with a top surface of the second dielectric layer.

17. The semiconductor memory device of claim 16, wherein an upper portion of the semiconductor pattern includes an impurity region that includes at least one halogen element including fluorine (F), chlorine (Cl), or bromine (Br), the upper portion being adjacent to the conductive pad.

18. The semiconductor memory device of claim 17, wherein an atomic percent of the at least one halogen element in the impurity region is in a range of 1 at % to 5 at %.

19. The semiconductor memory device of claim 16, wherein the conductive pad includes a gap adjacent to the top surface of the semiconductor pattern.

20. The semiconductor memory device of claim 16, wherein an uppermost part of a top surface of the charge storage layer is at a level higher than a level of an uppermost part of a top surface of the blocking dielectric layer.

* * * * *